(12) United States Patent
Park et al.

(10) Patent No.: US 10,636,939 B2
(45) Date of Patent: Apr. 28, 2020

(54) SEMICONDUCTOR DEVICE

(71) Applicant: LG INNOTEK CO., LTD., Seoul (KR)

(72) Inventors: Su Ik Park, Seoul (KR); Youn Joon Sung, Seoul (KR); Yong Gyeong Lee, Seoul (KR); Min Sung Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/308,594

(22) PCT Filed: Jun. 9, 2017

(86) PCT No.: PCT/KR2017/006009
§ 371 (c)(1),
(2) Date: Dec. 10, 2018

(87) PCT Pub. No.: WO2017/213455
PCT Pub. Date: Dec. 14, 2017

(65) Prior Publication Data
US 2019/0157504 A1 May 23, 2019

(30) Foreign Application Priority Data
Jun. 10, 2016 (KR) .................. 10-2016-0072797
Jun. 30, 2016 (KR) .................. 10-2016-0083059

(51) Int. Cl.
*H01L 33/10* (2010.01)
*H01L 33/32* (2010.01)
(Continued)

(52) U.S. Cl.
CPC ............. *H01L 33/10* (2013.01); *H01L 33/06* (2013.01); *H01L 33/22* (2013.01); *H01L 33/32* (2013.01);
(Continued)

(58) Field of Classification Search
CPC .......... H01L 33/10; H01L 33/32; H01L 33/22; H01L 33/06; H01L 33/405; H01L 33/20; H01L 33/382
(Continued)

(56) References Cited

U.S. PATENT DOCUMENTS

2011/0057223 A1 3/2011 Hwang
2012/0228660 A1 9/2012 Lee et al.
(Continued)

FOREIGN PATENT DOCUMENTS

EP         2 296 197       3/2011
KR     10-2011-0117964    10/2011
(Continued)

OTHER PUBLICATIONS

English Machine Translation, Seo, KR10-2013-0106675, 2013.*
(Continued)

*Primary Examiner* — Caleen O Sullivan
(74) *Attorney, Agent, or Firm* — KED & Associates, LLP

(57) ABSTRACT

One embodiment provides a semiconductor device comprising: a light-emitting structure which comprises a first conductive semiconductor layer, an active layer, and a second conductive semiconductor layer and also comprises first and second recesses which pass through the active layer from the second conductive semiconductor layer and extend to the first conductive semiconductor layer; a first electrode coming into contact with the first conductive semiconductor layer from the first recess; a second electrode coming into contact with the second conductive semiconductor layer; and a reflective layer formed in the second recess, wherein the second recess has an open lower part disposed on the downside of the second conductive semiconductor layer, an upper part disposed on the first conductive semiconductor layer, and a side part extending from the lower part to the (Continued)

upper part, and the reflective layer comprises a reflection part disposed inside the second recess and an extension part extending from the lower part of the second recess and coming into contact with the second electrode.

20 Claims, 16 Drawing Sheets

(51) Int. Cl.
  *H01L 33/22* (2010.01)
  *H01L 33/40* (2010.01)
  *H01L 33/06* (2010.01)
  *H01L 33/38* (2010.01)
  *H01L 33/20* (2010.01)
(52) U.S. Cl.
  CPC .......... *H01L 33/382* (2013.01); *H01L 33/405* (2013.01); *H01L 33/20* (2013.01)
(58) Field of Classification Search
  USPC .......................................................... 257/79
  See application file for complete search history.

(56) References Cited

U.S. PATENT DOCUMENTS

| | | |
|---|---|---|
| 2015/0226400 A1 | 8/2015 | Wada et al. |
| 2016/0093769 A1 | 3/2016 | Vom Dorp et al. |
| 2017/0222088 A1 | 8/2017 | Klemp |

FOREIGN PATENT DOCUMENTS

| | | |
|---|---|---|
| KR | 10-2012-0103270 | 9/2012 |
| KR | 10-2013-0106675 | 9/2013 |
| KR | 10-2015-0015730 | 2/2015 |
| KR | 10-2015-0074497 | 7/2015 |
| WO | WO 2012/132706 | 10/2012 |
| WO | WO 2014/195420 | 12/2014 |
| WO | WO 2016/050561 | 4/2016 |

OTHER PUBLICATIONS

English Machine Translation, Park, KR 10-2-15-0074497, 2015.*
International Search Report (with English Translation) and Written Opinion dated Sep. 8, 2017 issued in Application No. PCT/KR2017/006009.
European Search Report dated May 6, 2019 issued in Application No. 17810578.9.

* cited by examiner

SEMICONDUCTOR DEVICE

CROSS-REFERENCE TO RELATED PATENT APPLICATIONS

This application is a U.S. National Stage Application under 35 U.S.C. § 371 of PCT Application No. PCT/KR2017/006009, filed Jun. 9, 2017, which claims priority to Korean Patent Application No. 10-2016-0072797, filed Jun. 10, 2016, and Korean Patent Application No. 10-2016-0083059, filed Jun. 30, 2016, whose entire disclosures are hereby incorporated by reference.

TECHNICAL FIELD

The present invention relates to a semiconductor device, and more particularly, to a semiconductor device with improved extraction efficiency of light.

BACKGROUND ART

Light-emitting elements including compounds such as GaN, AlGaN, and the like have many advantages of wide and easily adjustable bandgap energy and the like such that the light-emitting elements may be variously used as light-emitting devices, light-receiving devices, various diodes, and the like.

Particularly, a light-emitting device such as a light-emitting diode (LED) or a laser diode using a compound semiconductor material of a Group III-V or II-VI compound semiconductor can implement various color light such as red light, green light, blue light, and ultraviolet rays with development of a thin film growth technique and an element material, can also implement white light with high efficiency using a fluorescent material or combining colors, and has advantages of low power consumption, a semi-permanent lifetime, a fast response speed, safety, and environmental friendliness as compared to conventional light sources such as fluorescent lamps and incandescent lamps.

In addition, when a light-receiving device such as a photodetector or a solar cell is manufactured using a Group III-V or II-VI compound semiconductor material, due to development of an element material, the light-receiving device absorbs light of various wavelength regions to generate a photoelectric current so that light in various wavelength regions from gamma rays to a radio wavelength range may be used. Further, with advantages of a fast response speed, safety, environmental friendliness, and easy control of an element material, the light-receiving device can also be easily used for power control, a microwave circuit, or a communication module.

Accordingly, application of the light-emitting device has expanded to a transmission module of an optical communication device, an LED backlight replacing a cold cathode fluorescent lamp (CCFL) which configures a backlight of a liquid crystal display (LCD) device, a white LED lighting device capable of replacing a fluorescent lamp or an incandescent lamp, a headlight of a vehicle, traffic lights, a sensor for detecting a gas or fire, and the like. Further, application of a semiconductor device can be expanded to a high frequency application circuit, other power control device, and a communication module.

Particularly, a light-emitting device emitting light in an ultraviolet wavelength range can be used for curing, a medical use, and sterilization by acting curing and sterilization.

A conventional semiconductor device may be configured such that a light-emitting structure including a first conductive semiconductor layer, an active layer, and a second conductive semiconductor layer is disposed on a substrate, a first electrode is disposed on the first conductive semiconductor layer, and a second electrode is disposed on the second conductive semiconductor layer.

Light generated in the active layer of the semiconductor device can propagate in lateral and downward directions of the active layer in addition to in an upward direction thereof. Therefore, when light emitted from the semiconductor device travels in the lateral direction, there is a problem in that a traveling path of the light is increased or the light is absorbed inside the light-emitting structure such that extraction efficiency of the light is degraded.

DISCLOSURE

Technical Problem

Exemplary embodiments are directed to providing a light-emitting device with improved extraction efficiency of light.

Technical Solution

One aspect of the present invention provides a semiconductor device including a light-emitting structure having a first conductive semiconductor layer, an active layer, a second conductive semiconductor layer, and first and second recesses extending from the second conductive semiconductor layer to the first conductive semiconductor layer by passing through the active layer, a first electrode configured to come into contact with the first conductive semiconductor layer in the first recess, a second electrode configured to come into contact with the second conductive semiconductor layer, and a reflective layer formed at the second recess, wherein the second recess may have an open lower portion disposed on a lower surface of the second conductive semiconductor layer, an upper portion disposed on the first conductive semiconductor layer, and a lateral portion extending from the open lower portion to the upper portion, and the reflective layer may include a reflection part disposed at an interior of the second recess and an extension part extending from the lower portion of the second recess to come into contact with the second electrode.

The reflection part of the reflective layer may be formed from the lower portion of the second recess to the upper portion of thereof along the lateral portion of thereof, the lower portion of the second recess may be coplanar with the lower surface of the second conductive semiconductor layer, and the reflection part may have a predetermined height in a direction from the lower portion to the upper portion of the second recess.

A width at a lower surface of the reflective layer may be 1.5 to 28 times a height of the reflective layer.

The reflective layer may include a first part corresponding to the first conductive semiconductor layer and a second part corresponding to the second conductive semiconductor layer, and an inclination of a lateral surface of the first part may be different from an inclination of a lateral surface of the second part.

An angle between the lateral surface of the first part and a bottom surface may be smaller than an angle between the lateral surface of the second part and the bottom surface.

An upper surface of the reflective layer may be flat or have a curvature.

The reflective layer may be electrically connected to the second conductive semiconductor layer.

Another aspect of the present invention provides a semiconductor device including a light-emitting structure having a first conductive semiconductor layer, an active layer, a second conductive semiconductor layer, and a plurality of first and second recesses formed from the second conductive semiconductor layer to some region of the active layer and the first conductive semiconductor layer, and configured to emit light in an ultraviolet wavelength range, a first electrode disposed on a lower surface of the first conductive semiconductor layer exposed in each of the plurality of first recesses, a boundary region predetermined in each of the plurality of first recesses, a second electrode disposed on a lower surface of the second conductive semiconductor layer, and a reflective layer disposed at a height corresponding to a portion of the first conductive semiconductor layer and the active layer in each of the plurality of second recesses, wherein the semiconductor device may further include a low current density region disposed between the predetermined boundary regions of the plurality of first recesses, and the reflective layer may be disposed in the low current density region.

A horizontal cross section of the reflective layer may have a honeycomb shape.

A predetermined value may be in the range of 30% to 40% of $I_0$, and the $I_0$ may be a current density in the first conductive semiconductor layer in contact with the first electrode.

A region in which the current density has the predetermined value around the first electrode may be referred to as a boundary region, and a cross section of the reflective layer may be disposed to be circumscribed about a cross section of the boundary region.

The reflective layers may have a mutually extended structure by disposing the low current density regions to extend from one another and the reflective layers in the low current density regions.

The reflective layer may be disposed to surround each of the plurality of first recesses.

A height of each of the plurality of first recesses may be equal to a height of the second recess.

A width of each of the plurality of first recesses may be greater than a width of the second recess.

A lateral surface of a second etched region may have an inclination in the range of 20 degrees to 40 degrees with respect to a bottom surface.

The reflective layer may be disposed at a height corresponding to an upper surface and the lateral surface of the second etched region and the bottom surface.

Still another aspect of the present invention provides a semiconductor device including a light-emitting structure having a first conductive semiconductor layer, an active layer, a second conductive semiconductor layer, and a plurality of first etched regions formed from the second conductive semiconductor layer to some region of the active layer and the first conductive semiconductor layer, and configured to emit light in an ultraviolet wavelength range, a first electrode disposed on the first conductive semiconductor layer exposed in each of the plurality of first etched regions, a second electrode disposed on the second conductive semiconductor layer, and a reflective layer disposed from the first conductive semiconductor layer to the active layer and the second conductive semiconductor layer a peripheral region of the first electrode, wherein the reflective layer may be disposed in a region in which a current density has a predetermined value or less.

The predetermined value may be in the range of 30% to 40% of $I_0$, and the $I_0$ may be a current density in the first conductive semiconductor layer in contact with the first electrode.

A region in which the current density has the predetermined value around the first electrode may be referred to as a boundary region, and a cross section of the reflective layer may be disposed to be inscribed or circumscribed about a cross section of the boundary region.

Advantageous Effects

In accordance with a semiconductor device according to exemplary embodiments, a first electrode is disposed in each of first recesses to supply electrons and a reflective layer is disposed in a second recess between the first recesses, and particularly, an arrangement and a shape of the reflective layer are optimized to reflect light emitted from an active layer such that, when the semiconductor device is a light-emitting device, extraction efficiency of the light can be improved.

Various beneficial advantages and effects of the present invention are not limited by the above description and should be easily understood through a description of a detailed embodiment of the present invention.

MODES OF THE INVENTION

Hereinafter, exemplary embodiments of the present invention capable of realizing the above-described objects will be described with reference to the accompanying drawings.

In the description of the embodiments according to the present invention, when an element is described as being formed "on" or "under" another element, the terms "on" or "under" includes the meaning of the two components bring in direct contact with each other (directly) and the meaning of one or more other components being disposed and formed between the two components (indirectly). Further, when an element is described as being formed "on" or "under" another element, the description may include the meaning of the other element being formed in an upward direction of the element and formed in a downward direction of the element.

A semiconductor device may include various electronic devices such as a light-emitting device, a light-receiving device, and the like, and both of the light-emitting device and the light-receiving device may include a first conductive semiconductor layer, an active layer, and a second conductive semiconductor layer.

A semiconductor device according to an exemplary embodiment may be a light-emitting device.

The light-emitting device emits light by recombination of electrons and holes, and a wavelength of the light is determined by an inherent energy band gap of a material. Thus, the emitted light may be varied according to a composition of the material.

When a light-emitting structure includes AlGaN in which a composition ratio of aluminum (Al) is large, the light-emitting structure may emit ultraviolet rays, particularly, light in a deep ultraviolet wavelength range. For example, ultraviolet rays may have a wavelength in the range of 10 nanometers (nm) to 400 nm, near-ultraviolet rays (UV-A) may have a wavelength in the range of 320 nm to 400 nm, far-ultraviolet rays (UV-B) may have a wavelength in the range of 280 nm to 320 nm, and deep-ultraviolet rays (UV-C) may have a wavelength in the range of 100 nm to 280 nm.

Figure 1:
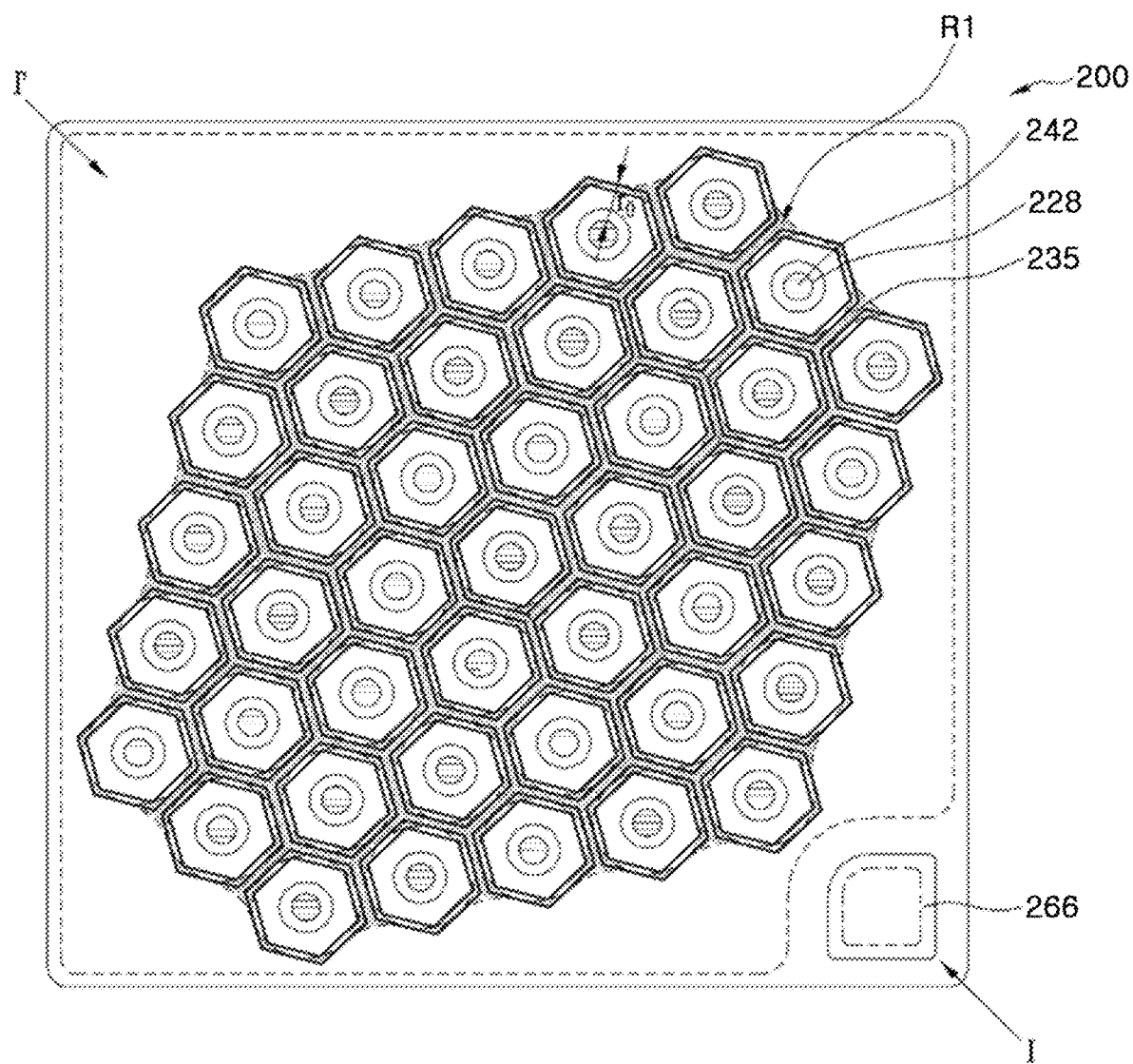
FIG. 1 is a plan view of a semiconductor device according to one embodiment.
Figure 2:
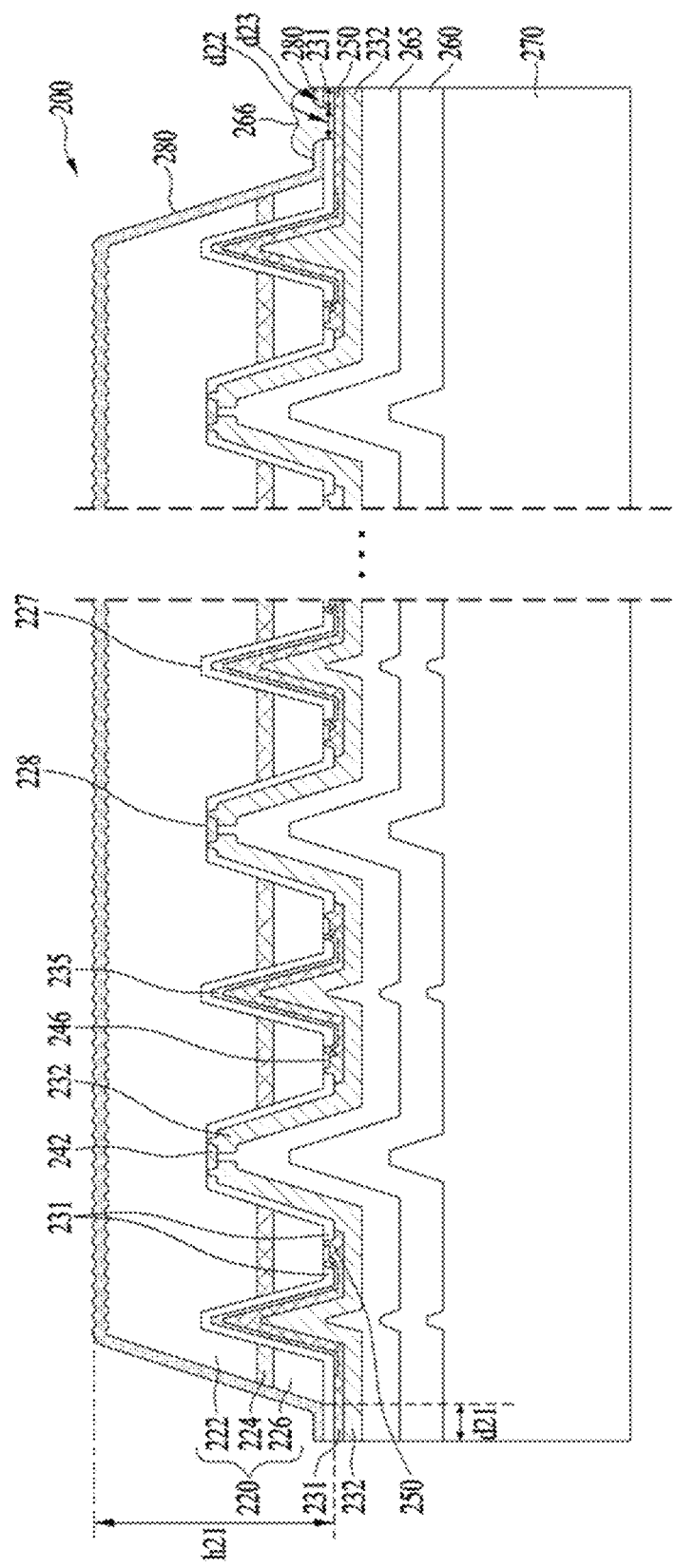
FIG. 2 is a cross-sectional view taken along line I-I' of the semiconductor device of FIG. 1.
Figure 3:
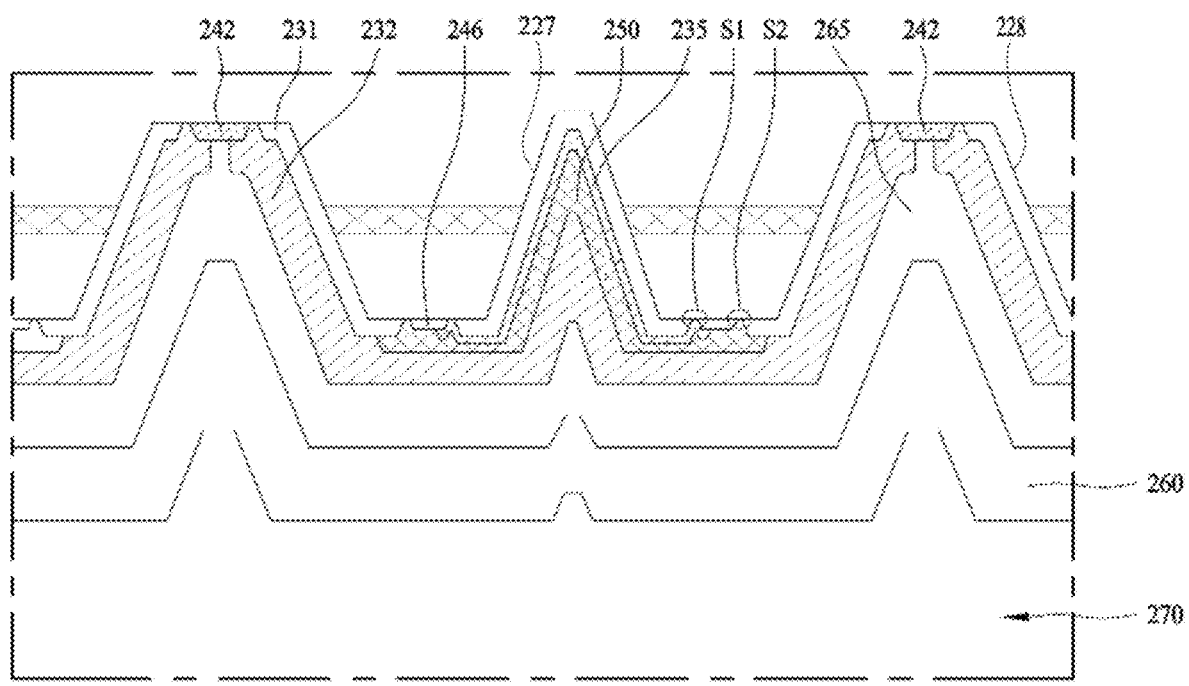
FIGS. 3 to 5 are detailed diagrams illustrating portions of FIG. 2.
Figure 4:
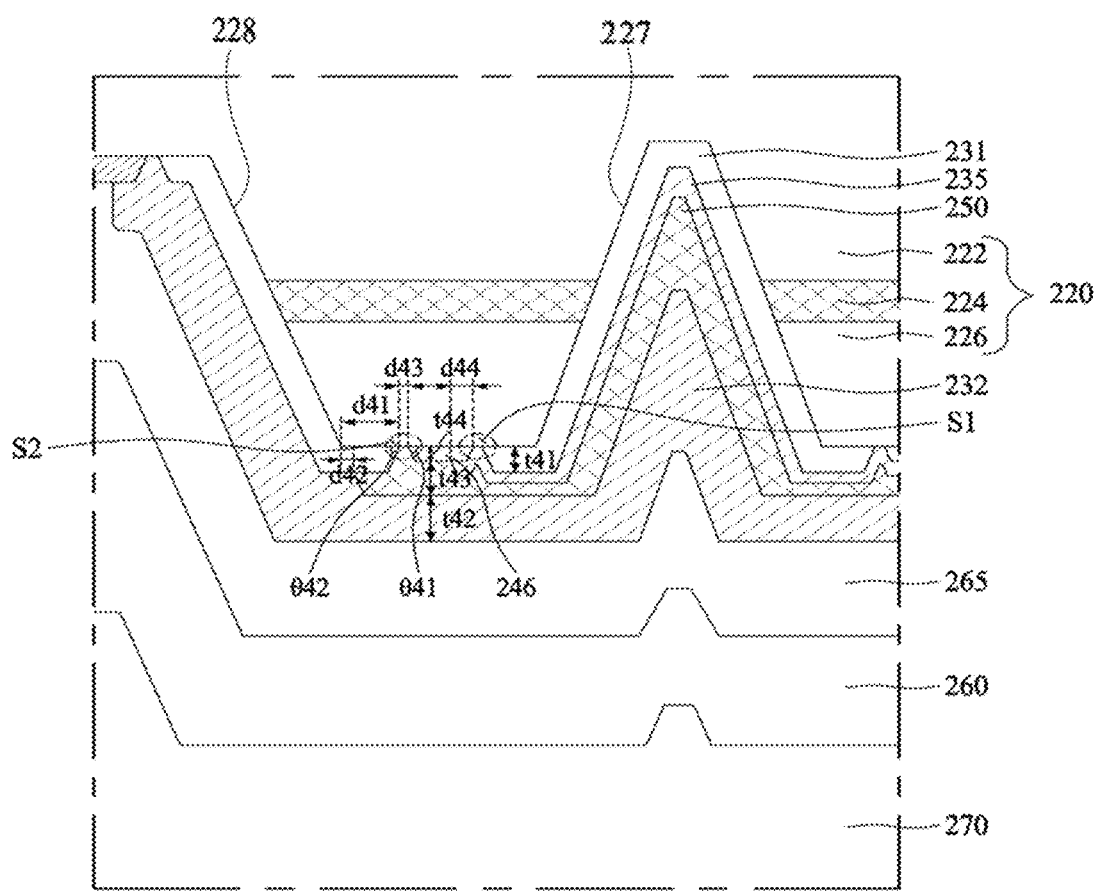
Figure 5:
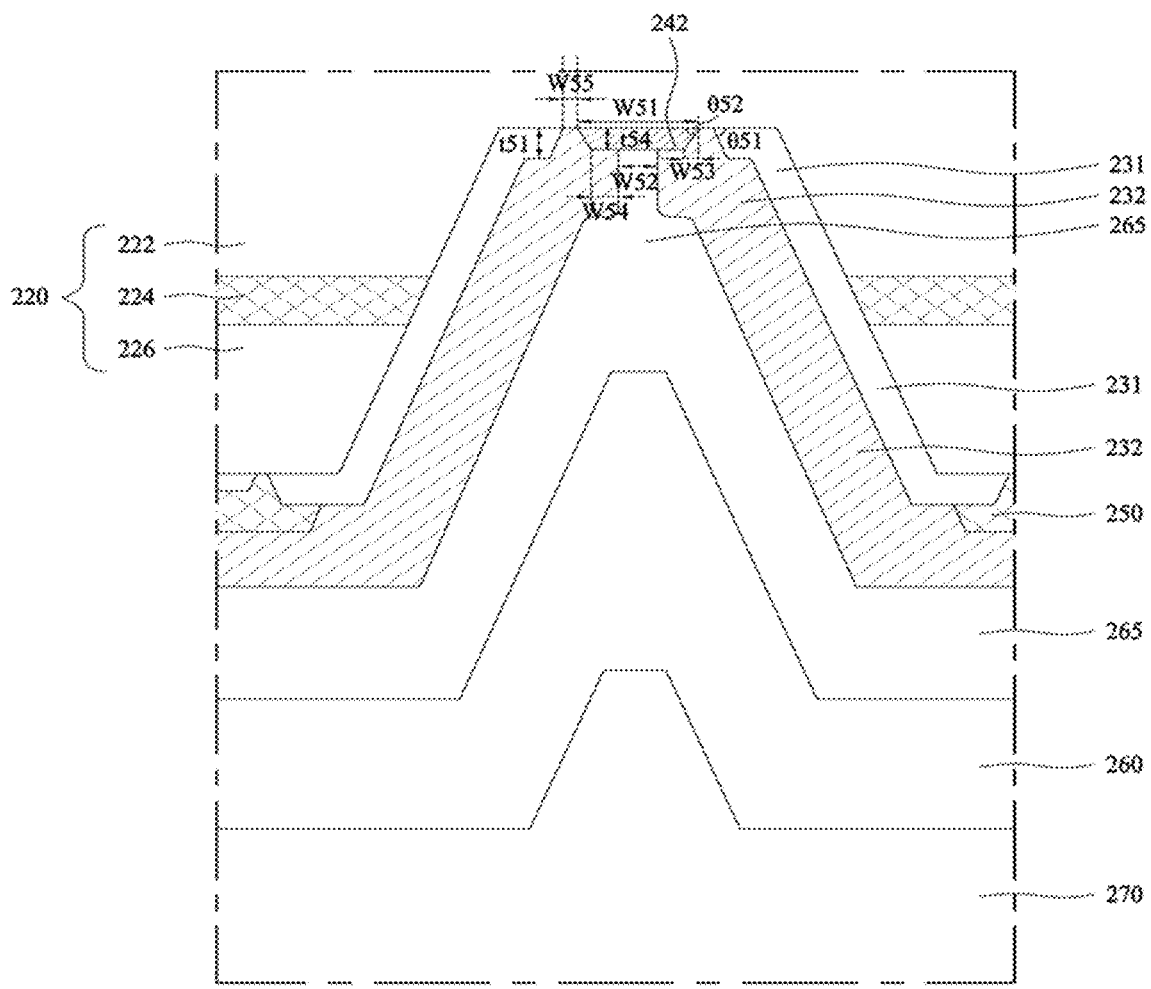

FIG. 1 is a plan view of a semiconductor device according to one embodiment, FIG. 2 is a cross-sectional view taken along line I-I' of the semiconductor device of FIG. 1 according to one embodiment, and FIGS. 3 to 5 are detailed diagrams illustrating portions of FIG. 2.

In FIG. 1, the semiconductor device is configured such that a reflective layer 235 is disposed in a low current density region R1 between a first electrode 242 and a first recess 228, and the low current density region R1 may be spaced a distance $r_0$ apart from the first electrode 242. In a semiconductor device, a structure formed of a first electrode and recesses can actually be configured with a larger number of first electrodes and recesses and can be designed in consideration of a current density so that the number of first electrodes and recesses is not limited. In consideration of a current density of the first electrode, the first electrode is disposed such that a low current density region can be designed and a reflective layer can be disposed between the low current density regions.

A semiconductor device 200 according to the present embodiment may include a semiconductor structure 220 having a first conductive semiconductor layer 222, an active layer 224, and a second conductive semiconductor layer 226, the first electrode 242 in contact with the first conductive semiconductor layer 222, and a second electrode 246 in contact with the second conductive semiconductor layer 226.

A first recess is provided from the second conductive semiconductor layer 226 to some region of the active layer 224 and the first conductive semiconductor layer 226 to expose a plurality of regions of the first conductive semiconductor layer 222, and the plurality of exposed regions may be classified into the first recess 228 and a second recess 227. For example, a cross section of each of the first recess 228 and the second recess 227 is a circular shape, a polygonal shape, an elliptical shape, and the like, but the present invention is not particularly limited thereto. The second recess 227 may be disposed at a circumference of the first recess 228 and will be described below with reference to FIG. 6 and the like.

The first electrode 242 may be disposed on the first conductive semiconductor layer 222 exposed in the first recess 228, and the second electrode 246 may be disposed on a lower surface of the second conductive semiconductor layer 226 between the first recess 228 and the second recess 227. Further, the reflective layer 235 may be disposed by being inserted into the second recess 227. A portion of the reflective layer 235 may be disposed to extend to a region outside of the second recess 227 and will be described below with reference to FIG. 3 and the like.

The portion of the reflective layer 235 may be disposed at a height corresponding to the active layer 224 and a height corresponding to a portion of the first conductive semiconductor layer 222. That is, an upper surface of the reflective layer 235 may be disposed to be higher than the active layer 224.

When a large amount of aluminum (Al) is contained in the light-emitting structure 220, a current diffusion characteristic may be degraded in the light-emitting structure 220. Thus, in the present embodiment, the light-emitting structure 220 in a region at which a current density is low may be etched and removed to form the reflective layer 235. The reflective layer 235 may emit light in a transverse magnetic (TM) mode in the active layer and change a path of the light traveling in a horizontal direction into an upward direction. Consequently, the reflective layer 235 may reduce light absorption in the light-emitting structure, adjust an angle of directivity of the semiconductor device, and improve extraction efficiency of light.

The reflective layer 235 may be formed of a conductive material, e.g., a metal. For example, when the reflective layer 235 is made of Al and light in an ultraviolet wavelength range is emitted from the active layer 224, the reflective layer 235 is formed to have a thickness of 50 nm or more so that it may be sufficient to reflect the light in the ultraviolet wavelength range by 80% or more.

Particularly, in the semiconductor device 200 emitting light in a UV-B or UV-C wavelength range, the light-emitting structure 220 is grown based on AlGaN such that light emission in the TM mode may be increased as compared with a light-emitting device emitting light in a blue wavelength range. TM mode emission may be defined as that light generated in the active layer is mostly emitted in a direction perpendicular to a growth direction of the light-emitting structure 220 (a horizontal direction in FIG. 2).

The reflective layer 235 may reflect light traveling in a lateral direction from the active layer 224 to change a traveling direction of the light and shorten an optical path thereof, thereby reducing light re-absorption in the light-emitting structure 220.

The first conductive semiconductor layer 222 may be formed of a Group III-IV or II-V compound semiconductor and may be doped with a first conductive dopant. The first conductive semiconductor layer 222 may be grown with one or more among AlGaN, GaN, InAlGaN, AlGaAs, GaP, GaAs, GaAsP, AlGaInP, and a semiconductor material having a composition formula of $Al_xIn_yGa_{(1-x-y)}N$ (0≤x≤1, 0≤y≤1, and 0≤x+y≤1).

When the first conductive semiconductor layer 222 is an n-type semiconductor layer, the first conductive dopant may include an n-type dopant such as Si, Ge, Sn, Se, or Te. The first conductive semiconductor layer 222 may be formed as a single layer or multiple layers, but the present invention is not limited thereto.

The active layer 224 may have any one of a single well structure, a multiple well structure, a single quantum well structure, a multi-quantum well (MQW) structure, a quantum dot structure, and a quantum-wire structure.

The active layer 224 may be formed of a well layer and a barrier layer, e.g., a pair structure of one or more among AlGaN/AlGaN, InGaN/GaN, InGaN/InGaN, AlGaN/GaN, InAlGaN/GaN, GaAs(InGaAs)/AlGaAs, and GaP(InGaP)/AlGaP, but the present invention is not limited thereto. The well layer may be formed of a material having an energy band gap that is smaller than an energy band gap of the barrier layer.

The second conductive semiconductor layer 226 may be formed of a Group III-IV or II-V compound semiconductor and may be doped with a second conductive dopant. The second conductive semiconductor layer 226 may be formed of one or more among AlGaN, GaN, AlInN, AlGaAs, GaP, GaAs, GaAsP, AlGaInP, and a semiconductor material having a composition formula of $In_xAl_yGa_{1-x-y}N$ ($0 \leq x \leq 1$, $0 \leq y \leq 1$, and $0 \leq x+y \leq 1$).

When the second conductive semiconductor layer 226 is made of AlGaN, an injection of holes may not be smooth due to low electrical conductivity of AlGaN. In this case, such a problem may be solved by disposing GaN having relatively high electrical conductivity at the lower surface of the second conductive semiconductor layer 226.

When the second conductive semiconductor layer 226 is a p-type semiconductor layer, the second conductive dopant may include a p-type dopant such as Mg, Zn, Ca, Sr, Ba, or the like. The second conductive semiconductor layer 226 may be formed as a single layer or multiple layers, but the present invention is not limited thereto.

Irregularities may be formed on an upper surface of the first conductive semiconductor layer 222 and may improve extraction efficiency of the light emitted from the light-emitting device 200. A width may become wider from the first conductive semiconductor layer 222 toward the active layer 224, an electron blocking layer, and the second conductive semiconductor layer 226, and this is because a width of a lower structure of the light-emitting structure 220 may be etched more wider in an etching process.

For example, a height h21 of the light-emitting structure 220 may be in the range of 2 μm to 3 μm. In the case of the light-emitting structure 220 emitting ultraviolet rays, in order to increase extraction efficiency of light having a short wavelength that is shorter than a blue wavelength, a depth of each of the irregularities on the upper surface may be in the range of 3000 angstroms (Å) to 8000 Å and may have an average depth of about 5000 Å.

A capping layer 250 may be disposed at the lower surface of the second conductive semiconductor layer 226 to surround at least a portion of a lower surface and a lateral surface of the second electrode 246. The capping layer 250 may be made of a conductive material, e.g., a metal. Specifically, the capping layer 250 may be made of at least one material selected from the group consisting of chromium (Cr), Al, titanium (Ti), gold (Au), and nickel (Ni), and an alloy thereof.

The capping layer 250 may electrically connect the second electrode 246 to a second electrode pad 266 and surround and support the second electrode 246 and the reflective layer 235, thereby securing stability. The capping layer 250 may be made of a metal having high reflectance to reflect light. Accordingly, the reflective layer 235 may be defined as a first reflective layer, and the capping layer 250 may be defined as a second reflective layer.

A first conductive layer 265 and a bonding layer 260 may be disposed along a lower surface of the light-emitting structure 220 and topography of the first recess 228 and the second recess 227.

The first conductive layer 265 may electrically connect a plurality of first electrodes 242. The first conductive layer 265 may be made of a material having high reflectance, e.g., Al. For example, in the ultraviolet wavelength range, a thickness of the first conductive layer 265 should be provided with 500 Å or more so as to secure light reflectance of 80% or more.

The bonding layer 260 may be a region including a region for diffusion bonding or eutectic bonding the first conductive layer 265 to a support substrate 270 below the bonding layer 260, which includes a region in which Ni, Sn, Au, and the like are mixed.

The bonding layer 260 may be made of a conductive material. For example, the bonding layer 260 may be formed of a material selected from the group consisting of Au, Sn, In, Al, silicon (Si), silver (Ag), Ni, Copper (Cu), or an alloy thereof.

A diffusion barrier layer (not shown) may be disposed between the first conductive layer 265 and the bonding layer 260. For example, the diffusion barrier layer may have a multi-layered structure of Ti/Ni/Ti/Ni.

The support substrate 270 may be made of a conductive material, e.g., a metal or a semiconductor material. Thus, a current may be injected into the first conductive semiconductor layer 222 via the support substrate 270, the bonding layer 260, the first conductive layer 265, and the plurality of first electrodes 242. Further, the support substrate 270 may be formed of a material having high thermal conductivity to sufficiently dissipate heat generated during an operation of the light emitting device.

The support substrate 270 may be made of a material selected from the group consisting of Si, molybdenum (Mo), Si, tungsten (W), Cu, and Al, or an alloy thereof. Further, the support substrate 270 may selectively contain Au, a Cu alloy, Ni, Cu—W, and a carrier wafer (e.g., GaN, Si, Ge, GaAs, ZnO, SiGe, SiC, SiGe, $Ga_2O_3$, or the like).

A second electrode pad 266 may be disposed at a corner of one side of the semiconductor device 200. The second electrode pad 266 may be made of a conductive material, e.g., a metal, and may have a single layer structure or a multilayered structure. Specifically, the second electrode pad 266 may have a structure formed of Ti/Ni/Ti/Ni/Ti/Au.

The second electrode pad 266 having a recessed central portion may be disposed. A wire (not shown) may be bonded around the recessed central portion and a bonding area becomes wider such that the second electrode pad 266 and the wire may be bonded more firmly.

The second electrode pad 266 may act to reflect light such that extraction efficiency of light may be improved as the second electrode pad 266 is close to the light-emitting structure 220, but when the second electrode pad 266 and the light-emitting structure 220 are too close each other, it may be difficult to secure a process margin.

A first insulating layer 231 may be partially open at a lower portion of the second electrode pad 266 such that the capping layer 250 and the second electrode pad 266 may be electrically connected. A passivation layer 280 is disposed at upper and lateral surfaces of the light-emitting structure 220.

The first insulating layer 231 and the passivation layer 280 may be in contact with each other in a region adjacent to the second electrode pad 266.

For example, a width d22 of a portion at which the first insulating layer 231 is open and thus the second electrode pad 266 is in contact with the capping layer 250 may be in the range of about 40 µm to 90 µm. When the width d22 is less than 40 µm, there is a problem in that an operating voltage rises, whereas when the width d22 is greater than 90 µm, it may be difficult to secure a process margin for not exposing the capping layer 250 to the outside. When the capping layer 250 is exposed to an outer region of the second electrode pad 266, reliability of the device may be degraded. Consequently, the width d22 may be in the range of about 60% to about 95% of an overall width of the second electrode pad 266.

For example, a width d23 of a portion ranging from an edge of the open portion of the first insulating layer 231 to an edge of the second electrode pad 266 may be in the range of 5 µm to 10 µm. When the width d23 is less than 5 µm, it is difficult to secure a process margin, whereas when the width d23 is equal to or greater than 10 µm, the width d22 of the portion at which the second electrode pad 266 is in contact with the capping layer 250 may become narrower to cause a problem in that the operating voltage rises. In consideration of the stable bonding with the wire, the overall width of the second electrode pad 266 may be in the range of 50 µm and 150 µm. When the overall width is less than 50 µm, there is a problem in that it is difficult to secure a sufficient area for bonding the wire, whereas when the overall width is greater than 150 µm, an area of the second electrode occupying an entire area of the semiconductor device becomes wider such that there is problem of narrowing a light emission region.

For example, a thickness of the passivation layer 280 may be about 3000 Å, and a width d21 of the passivation layer 280 from the lateral surface of the light-emitting structure 220 may be in the range of 10 µm to 30 µm. A region corresponding to the width d21 may correspond to a channel at an edge of the semiconductor device 200 and may be a region separated in a device unit after the growth of the light-emitting structure 220 at a wafer level. For example, in a separating process in a device unit, the semiconductor device may be separated by laser scribing, and a molten metal or the like may be disposed at a height of about 3 µm, which is higher than that of the light-emitting structure 220, in an upward direction of the channel from an upper portion of the passivation layer 280.

FIG. 3 is a detailed diagram illustrating a region adjacent to the reflective layer, FIG. 4 is a detailed diagram illustrating a region adjacent to the second electrode, and FIG. 5 is a detailed diagram illustrating a region adjacent to the first electrode.

In FIG. 3, the reflective layer 235 is disposed inside the second recess 227. The reflective layer 235 includes the lower surface of the second conductive semiconductor layer from a vertically overlapping portion with the second electrode, the open region disposed at a lower portion of the second recess 227, a lateral portion extending from the lower portion to an upper portion of the second recess 227, and an extension portion extending to the upper portion of the second recess 227 to be electrically connected to the second electrode.

The reflective layer 235 may be made of at least one material selected from the group consisting of Cr, Al, Ti, Au, and Ni, and an alloy thereof. When the reflective layer 235 is made of Al and light in the ultraviolet wavelength range is emitted from the active layer 224, a thickness of the reflective layer 235 should be provided with, e.g., at least 500 Å or more so as to secure light reflectance of 80% or more.

For example, the reflective layer 235 may have a layered structure of Al, Ti, Au, and Ti at an upper portion of FIG. 2 in a downward direction.

The first insulating layer 231 may be disposed between the light-emitting structure 220 and the reflective layer 235, and the capping layer 250 may be disposed below the reflective layer 235. The reflective layer 235 may be in Schottky contact with the light-emitting structure 220 in a region S1 of an edge of the second electrode 246.

The capping layer 250 may be disposed below the reflective layer 235 to come into contact with the second electrode 246 and surround a lower portion and a lateral surface of the reflective layer. Further, the capping layer may be disposed to extend to some region of the first insulating layer 231 which extends from an upper portion of the first recess 228 to an upper portion of the second conductive semiconductor layer. Thus, the capping layer may be in Schottky contact with the light-emitting structure 220 in a region S2 of the edge of the second electrode 246. The reflective layer 235 and the second conductive semiconductor layer 226 are in Schottky contact with each other in the region S1, and the capping layer 250 and the second conductive semiconductor layer 226 are in Schottky contact with each other in the region S2 such that it may be advantageous for diffusion of a current supplied to the second conductive semiconductor layer 226.

Each of widths of the regions S1 and S2, in which the Schottky contact is made, may be in the range of 1 µm to 2 µm, the widths may be secured through a self-aligned process, and when the reflective layer 235 and the capping layer 250 are formed, a step coverage characteristic is good such that reliability may be improved.

That is, in FIG. 4, the light-emitting structure 220 and the reflective layer 235 may be in Schottky contact with each other in the region S1 of an edge of one side of the second electrode 246, and the light-emitting structure 220 and the capping layer 250 may be in Schottky contact with each other in the region S2 of an edge of the other side of the second electrode 246.

A second insulating layer 232 may be disposed below the capping layer 250, and the first conductive layer 265 may be disposed below the second insulating layer 232. The first conductive layer 265 may control an angle of directivity by changing a direction of light emitted to the first recess 228 toward the upward direction and reduce probability of the light being reabsorbed inside the light-emitting device by shortening an optical path.

A thickness t44 of the second electrode 246 may be 40% to 80% of a thickness t41 of the first insulating layer 231, e.g., 2000 Å. The reflective layer 235 and the capping layer 250, which are in Schottky contact with each other in the regions S1 and S2, may protrude to the light-emitting structure 220, i.e., in a direction of the second conductive semiconductor layer 226. The protruding portion of the reflective layer 235 may have a dimension identical to the thickness t44 of the second electrode 246. Alternatively, the reflective layer 235 and the capping layer 250 may be flat without the protruding portions.

The thickness t41 of the first insulating layer 231 may be less than a thickness t42 of the second insulating layer 232. The thickness t41 of the first insulating layer 231 may be in the range of 3000 Å to 7000 Å, e.g., 5000 Å, and the thickness t42 of the second insulating layer 232 may be in the range of 4000 Å to 10000 Å, e.g., 8000 Å.

When the thickness t41 of the first insulating layer 231 and the thickness t42 of the second insulating layer 232 are thinner than the above-described ranges, reliability for electrical separation of the first electrode 242 and the reflective layer 235 may be degraded, whereas when the thickness t41 of the first insulating layer 231 and the thickness t42 of the second insulating layer 232 are thicker than the above-described ranges, defects such as cracks or voids may be generated due to a pressure applied when the support substrate 270 is bonded through the bonding layer 260 such that reliability may be reduced. Further, a thickness t43 of the capping layer 250 may be thicker than the thickness t41 of the first insulating layer 231, may be thinner than the thickness t42 of the second insulating layer 232, and may be in the range of 3000 Å to 8000 Å. When the thickness t43 of the capping layer 250 is less than 3000 Å, it is difficult to diffuse the supplied current such that the operating voltage may rise, whereas when the thickness t43 of the capping layer 250 is greater than 8000 Å, delamination may be generated at an interface between layers constituting the semiconductor device due to stress. For example, the thickness t43 of the capping layer 250 may be 6000 Å.

In FIG. 4, a distance d43 of the region S2 in which the capping layer 250 is in Schottky contact with the second conductive semiconductor layer 226 may be in the range of 1 μm to 2 μm. The first insulating layer 231 may form inclined surfaces having acute angles θ1 and θ2 with interfaces of the second conductive semiconductor layer 226 and the first insulating layer 231 in both regions of the first insulating layer 231 adjacent to the region S2 in which the capping layer 250 is in Schottky contact with the second conductive semiconductor layer 226. Since the inclined surfaces have the acute angles, it is possible to reduce defects such as cracks and voids due to a pressure applied in a bonding process with the support substrate 270 below, thereby preventing degradation of reliability.

A distance d41 of a region in which the lower surface of the second conductive semiconductor layer 226 and the first insulating layer 231 are in contact with each other in a direction of the first recess 228 from the above-described region S2 may be in the range of, e.g., 5 μm to 15 μm. Further, since the inclined surfaces have the acute angles θ41 and θ42, a distance d42 of a region corresponding from a distal end of a region, in which the capping layer 250 of the layers below the first insulating layer 231 is in contact with the inclined surface, to a distal end of the lower surface of the second conductive semiconductor layer 226 may be in the range of, e.g., 4 μm to 8 μm.

Furthermore, a horizontal distance d44 of a region in which the reflective layer 235 vertically overlaps with the second electrode 246 may be within the range of, e.g., 4 μm to 8 μm in a direction from the Schottky contact region S1 to the second electrode 246. The second electrode 246 and the reflective layer 235 may vertically overlap within the above-described distance d44 to reflect upward light which is traveling downward, and in consideration of a process margin, the distance d44 may be in the range of 2 μm to 8 μm. When the distance d44 is less than 2 μm, it may be difficult to secure a process margin for which the reflective layer 235 is in contact with the second electrode 246, whereas when the distance d44 is greater than 8 μm, delamination may occur due to a difference in stress with the second electrode 246. Here, a vertical direction is the upward-downward direction in the drawing and may be a growth direction of the light-emitting structure.

In FIG. 5, a thickness t54 of the first electrode 242 disposed below the first conductive semiconductor layer 222 in the first recess 228 may be less than a thickness t51 of the first insulating layer 231. Specifically, the thickness t54 of the first electrode 242 may be 40% to 80% of the thickness t51 of the first insulating layer 231, e.g., 2000 Å. When the thickness t54 of the first electrode 242 is formed to be less than the thickness t51 of the first insulating layer 231 and thus the second insulating layer 232 is disposed between the first electrode 242 and the first insulating layer 231, a step coverage may be improved.

Further, a lateral surface of the first electrode 242 and a lateral surface of the first insulating layer 231, which are in contact with a lower surface of the first conductive semiconductor layer 222, may be respectively disposed to form an acute angle. Here, an angle θ51 between the lateral surface of the first insulating layer 231 and the lower surface of the first conductive semiconductor layer 222 and an angle θ52 between the lateral surface of the first electrode 242 and the lower surface of the first conductive semiconductor layer 222 may be equal to each other. For example, each of the angles θ51 and θ52 may be in the range of 30 degrees to 50 degrees. When each of the angles θ51 and θ52 is less than 30 degrees, a distance for which the first insulating layer 231 has a sufficient thickness for insulation in the first recess 228 may become shorter, whereas when each of the angles θ51 and θ52 is greater than 50 degrees, a step coverage characteristic is not good when the second insulating layer 232 is disposed such that reliability may be degraded.

Further, when a via-hole is formed at the second insulating layer 232 so as to electrically connect the first conductive layer 231 to the first electrode 242 after the first electrode 242 is formed and the second insulating layer 232 is disposed, a width w51 of the first electrode 242 may be greater than a width w52 of a region in which the first conductive layer 265 is in contact with the first electrode 242. When a width of a region in which a lower surface of the first electrode 242 is in contact with the second insulating layer 232 is w54, and a horizontal width of a region in which the inclined surface of the second electrode 242 is in contact with the second insulating layer 232 is w53, the width w54 may be in the range of 1 μm to 10 μm in consideration of the process margin.

For example, a separation distance w55 between the first electrode 242 and the first insulating layer 231 may be 1 μm to 2 μm. The first conductive semiconductor layer 222 may be in contact with the second insulating layer 232 within the separation distance w55. The separation distance w55 may be secured through a self-aligned process, and when the second insulating layer 232 is formed, a step coverage characteristic is good such that reliability may be improved.

The first insulating layer 231, the second insulating layer 232, and the passivation layer 280 may be formed of an insulating material. For example, an Al oxide or an Al nitride may be used, and specifically, $SiO_2$ or SiN may be used.

Figure 6:
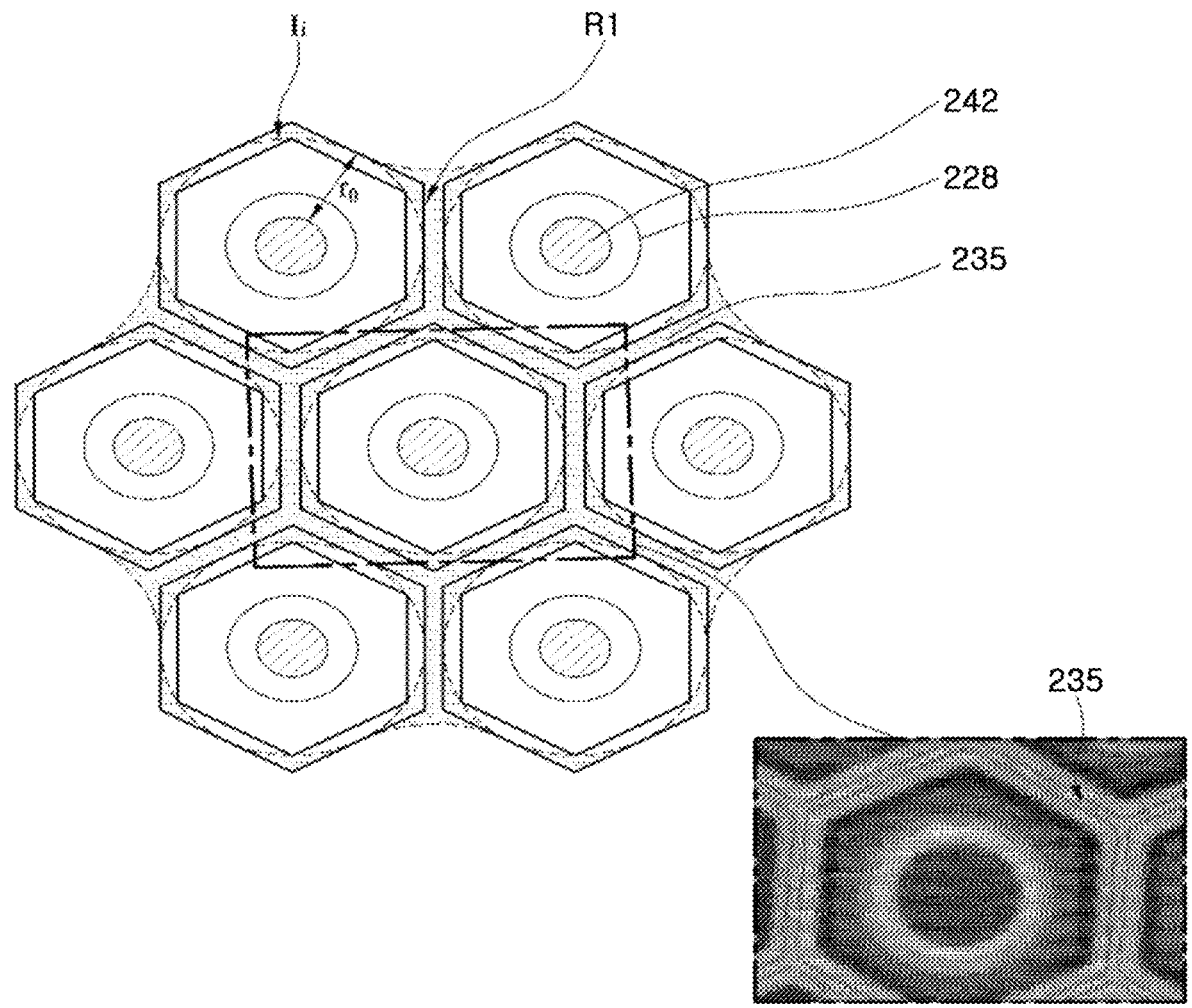
FIG. 6 is a diagram illustrating an arrangement of a reflective layer in the plan view of FIG. 2.

FIG. 6 is a diagram illustrating an arrangement of the reflective layer in the plan view of FIG. 2.

A plurality of first electrodes 242 are disposed at the semiconductor device 200, the first recess 228 is disposed in a form of a hole around each of the first electrodes 242, and the capping layer 250 is disposed around the first recess 228. As described in FIG. 2, a portion indicated by dotted lines may be a region in which the first insulating layer 231 is open and thus the second electrode 246 and the capping layer 250 are in contact with each other.

The region indicated by dotted lines is an interior of the light-emitting structure, the light-emitting structure is covered with the passivation layer 280 above, and the first electrode, the recess, and the capping layer may be disposed in a smaller size structure and with a larger number than those shown in the drawing.

The first electrode 242 may be in ohmic contact with the first conductive semiconductor layer. In this case, a current in the ohmic contact region may be called as $I_0$. A current density decreases as being apart from the ohmic contact region and thus coupling between electrons and holes in the active layer decreases such that optical power may be degraded.

In this case, the reflective layer 235 may be disposed in the vicinity of a region in which a current density is lowered to a predetermined value or less.

Specifically, in FIG. 6, the plurality of first electrodes 242 are each shown in a circular shape, regions which are spaced the distance $r_0$ apart from the first electrodes 242 are shown in dotted lines, and a current density in each of the regions indicated by the dotted lines is which will be described below with reference to FIG. 7. The region indicated by the dotted lines may be referred to as a "boundary region," and the boundary region may be in a circular shape, but as described above, the shape of the boundary region may be varied according to a shape of the first electrode and the present invention is not limited to the circular shape. The current density $I_i$ in the boundary region may be 30% to 40% of $I_0$. For example, the current density $I_i$ may be expressed as $I_i = I_0 \times \exp(-1)$.

Further, a region between a plurality of boundary regions may be referred to as the "low current density region R1," and a current density in the low current density region may be less than the current density $I_i$. In the present embodiment, the reflective layer 235 is circumscribed about a "boundary region" around a single first electrode, and the plurality of "boundary regions" may be circumscribed about or separated apart from each other by a separation distance. Therefore, when the boundary regions are circumscribed about each other, the low current density regions may be spaced apart from each other, and when the boundary regions are spaced apart from each other, each of the low current density regions may be disposed to extend. In an enlarged view of FIG. 6, like a structure in which the reflective layers 235 are disposed with the separation distance of the "boundary region," the reflective layers 235 may be disposed in a mutually extended structure and may be disposed to be spaced apart from each other. In the enlarged view of FIG. 6, when the reflective layers are disposed in the mutually extended structure, a region in which one or more reflective layers are in contact with each other may be provided, and the one or more reflective layers may be in contact with each other with a curvature in that region. An arrangement of the boundary regions may be varied according to an arrangement of the first electrodes 242 so that a shape of an upper surface of the reflective layer may be a hexagonal shape, but the present invention is not limited thereto. The hexagonal shape may be a structure similar to a honeycomb, and the reflective layers 235 may be connected and disposed in the low current density regions around the first electrodes.

Specifically, the reflective layer 235 may be disposed in the "low current density region" between adjacent first electrodes, and vertexes of the reflective layer 235 having a hexagonal cross section may be disposed in a central region of each of the "low current density region." In this case, the reflective layer 235 may have a hexagonal structure connecting positions at which the adjacent boundary regions are in contact with each other or may be a polygon which is circumscribed about a single first electrode and a boundary region around the recess.

In FIG. 6, when a horizontal direction is referred to as a first direction and a vertical direction is referred to as a second direction, the first direction and the second direction may intersect with each other. Here, the meaning of intersection is close to verticality but not necessarily mathematically verticality.

In FIG. 6, two first recesses 228 are disposed in an uppermost row in the first direction, three first recesses 228 are disposed in a middle row, and two first recesses 228 are disposed in a lowermost row. In this case, the first recesses 228 disposed in the three rows arranged in the first direction are disposed to be offset from one another in the second direction.

Figure 7:
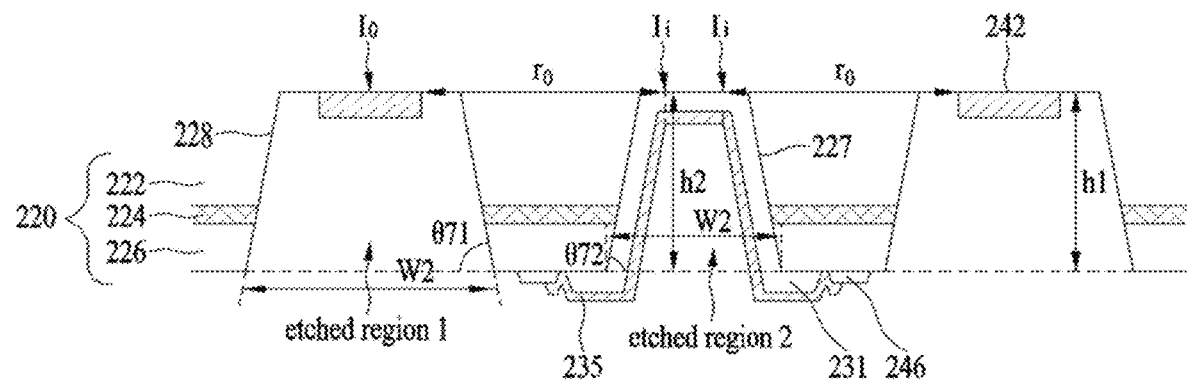
FIG. 7 is a detailed diagram illustrating an arrangement of a first recess, a second recess, and the reflective layer of FIG. 2.

FIG. 7 is a detailed diagram illustrating an arrangement of the first recess, the second recess, and the reflective layer of FIG. 2.

A height h1 of the first recess 228 and a height h2 of the second recess 227 may be equal to each other in the range of, e.g., 1 μm to 2 μm. This is because the first recess 228 and the second recess 227 may be formed by simultaneously etching the light-emitting structure in a manufacturing process. Here, the heights h1 and h2 are heights from a portion indicated by dashed lines, i.e., a lower surface of the light-emitting structure, to upper surfaces of the first recess 228 and the second recess 227.

Further, a width w1 of the first recess 228 may be greater than a width w2 of the second recess 227. This is because the second recess 227 is a space for disposing the reflective layer at a low current density region in the light-emitting structure so that the width w2 of the second recess 227 may be narrower than the width w1 of the first recess 228. When the width w2 of the second recess 227 is equal to or wider than the width w1 of the first recess 228, the low current density region becomes wider such that overall light emission efficiency of a chip may be degraded.

In FIG. 7, the width w1 of the first recess 228 and the width w2 of the second recess 227 are widths of lower surfaces of the first recess 228 and the second recess 227. Further, a width of the upper surface of the first recess 228 may be wider than a width of the upper surface of the second recess 227. A first etched region 1 and a second etched region 2 respectively correspond to the first recess 228 and the second recess 227, and the first recess 228 and the second recess 227 may be formed by other method rather than etching.

The above-described widths may refer to diameters when the first recess 228 and the second recess 227 have a circular cross section or may refer to lengths of one sides when the first recess 228 and the second recess 227 have a quadrangular cross section.

In FIG. 7, a width of an upper portion of each of the first recess 228 and the second recess 227 may be less than a width of a lower portion of each thereof. Thus, a width at a height corresponding to the first conductive semiconductor layer may be less than a width at a height corresponding to the second conductive semiconductor layer.

The width w1 of the lower portion of the first recess 228 may be in the range of 24 μm to 32 μm, e.g., 28 μm. The width w2 of the lower portion of second recess 227 may be widest in the range of 2 μm to 4 μm. When the width w2 of the lower portion of the second recess 227 is less than 2 μm, there is a problem of disposing the reflective layer 235 therein, whereas when the width w2 of the lower portion of the second recess 227 is greater than 4 μm, there is a problem in that an etching amount of the light-emitting structure, specifically, the active layer (MQW) is increased such that a light emission area is reduced.

Each of the height h1 of the first recess 228 and the height h2 of the second recess 227 may be in the range of 0.7 μm to 2 μm. When each of the height h1 of the first recess 228 and the height h2 of the second recess 227 is less than 1 μm, the first conductive semiconductor layer may not be exposed on the upper surface of each of the first recess 228 and he second recess 227, whereas when each of the height h1 of the first recess 228 and the height h2 of the second recess 227 is greater than 2 μm, etching is performed to the vicinity of the upper surface of the first conductive semiconductor layer such that the operating voltage of the semiconductor device may be increased.

An angle θ72 between a lateral surface of the second recess 227 and a bottom surface thereof may be in the range of 50 degrees to 70 degrees. When the angle θ72 is greater than 70 degrees and light emitted from the active layer is reflected from the lateral surface of the reflective layer corresponding to the lateral surface of the second recess 227, a distance of the light traveling to the outside becomes longer such that probability of light absorption in the light-emitting structure may increase. When the angle θ72 is less than 50 degrees, a volume of the light-emitting structure, particularly, a volume of the active layer which is removed may be increased during the formation of the second recess 227, thereby causing a reduction of coupling between electrons and holes and a reduction of a quantity of light.

An angle θ71 between a lateral surface of the first recess 228 and a bottom surface thereof may be equal to or smaller than the above-described angle θ72.

In FIG. 7, a part indicated by the dotted lines may be the bottom surface of each of the first recess 228 and second recess 227, and the bottom surface may be a surface which is parallel to and coplanar with the lower surface of the second conductive semiconductor layer 226.

In FIG. 7, the reflective layer 235 may be disposed in the second recess 227, and a shape of the reflective layer 235 may be similar to that of the second recess 227. An arrangement of the second electrode 246 and the first insulating layer 231 may be the same as described above.

When a current density in a contact region between the first electrode 242 and the first conductive semiconductor layer 222 is $I_0$, a current density in the first conductive semiconductor layer 222 in a region spaced a distance $r_0$ apart from the contact region may be $I_i$. The reflective layer 235 may be disposed below a point at which the current density is $I_i$.

Here, the current density $I_i$ at the point corresponding to a region in which the reflective layer 235 is formed may be set to a predetermined value. For example, the current density $I_i$ may be in the range of 30% to 40% of $I_0$ and may be expressed as $I_i = I_0 \times \exp(-1)$.

Figure 8A:
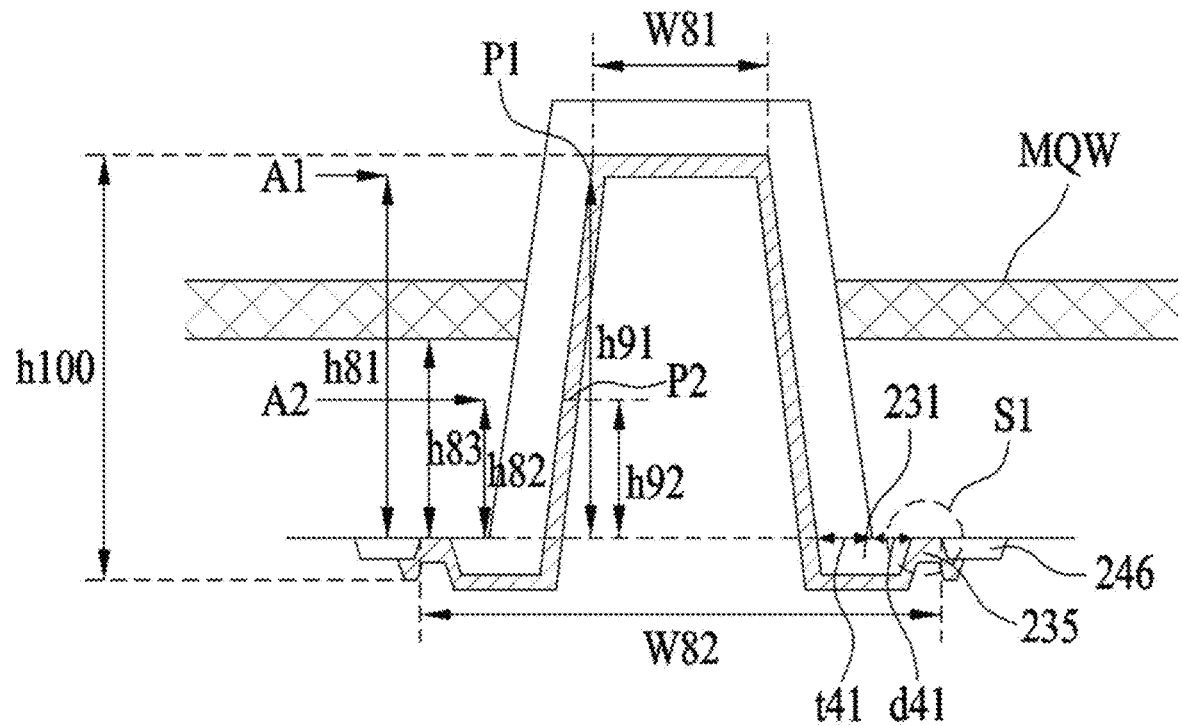
FIGS. 8A to 8C are diagrams illustrating shapes of the reflective layer.
Figure 8B:
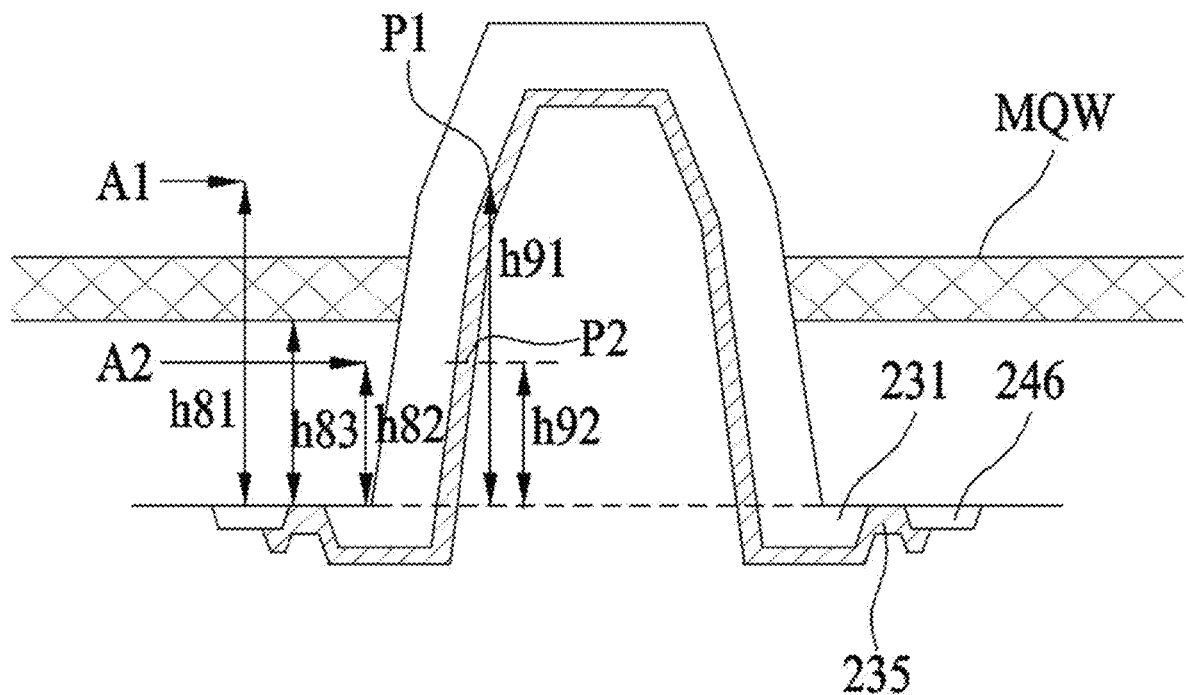
Figure 8C:
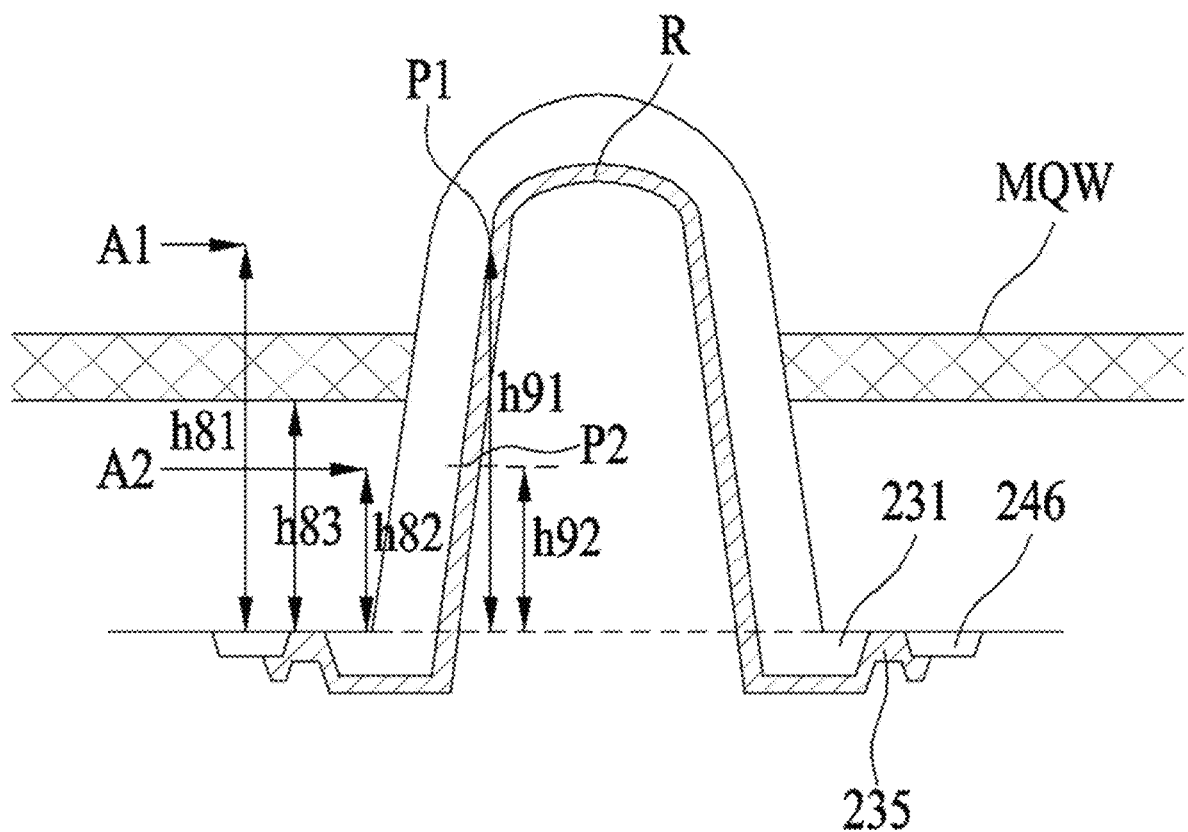

FIGS. 8A to 8C are diagrams illustrating shapes of the reflective layer 235.

In exemplary embodiments of FIGS. 8A to 8C, outer shapes of the reflective layer 235 are illustrated. For convenience, a region above the active layer MQW may be referred to as a first region P1, and a region below the active layer MQW may be referred to as a second region P2.

A height h91 of the first region P1 may correspond to a height h81 of a first position A1 of the first conductive semiconductor layer 222, and a height h92 of the second region P2 may correspond to a height h82 of a second position A2 of the second conductive semiconductor layer 226. A height h83 of the active layer MQW may be lower than the height h81 of the first position A1 and may be higher than the height h82 of the second position A2. Here, the heights h81, h82, h83, h91, and h92 may be heights from the bottom surface of the light-emitting structure or the second conductive semiconductor layer.

A width w81 of the upper surface of the reflective layer 235 may be in the range of 2 μm to 4 μm, and a height h100 of the reflective layer 235 may be in the range of 1 μm to 2 μm. Further, a width w82 of the lower surface of the reflective layer 235 may be greater than the width w81 of the upper surface thereof.

The width w82 of the lower surface of the reflective layer 235 may further extend to each of left and right sides at a portion corresponding to the width of the upper surface of the reflective layer 235 in the range of 3000 Å to 7000 Å which is the thickness t41 of the first insulating layer 231, in the range of 5 μm to 15 μm which is the distance d41 at which the first insulating layer 231 is in contact with the lower portion of the light-emitting structure, and in the range of 1 μm to 2 μm which is the width of the region S1 in which the reflective layer 235 is in Schottky contact with the light-emitting structure. Therefore, a relationship of W82=w81+2t41+2d41+2S1 may be established. The width w82 of the lower surface of the reflective layer 235 may be 1.5 to 28 times the height h100. That is, the width w82 of the lower surface of the reflective layer 235 may be equal to a distance between adjacent second electrodes 246.

In this case, since light may be reflected from the second electrode 246 before reaching the reflective layer 235, a region in which the reflective layer 235 overlaps with the second electrode 246 may not be included in the width w82 of the lower surface of the reflective layer 235.

When a width (the width w82 of the lower surface) of the reflective layer 235 is smaller than 1.5 times the height h100, an area of the reflective layer 235 becomes narrower such that there is a problem of reflecting light emitted in a downward direction to an upward direction, whereas when the width of the reflective layer 235 is greater than 28 times the height h100, delamination may occur at an interface between the second conductive semiconductor layer 226 and the second electrode 246 or between the reflective layer 235 and the second electrode 246 due to stress between the reflective layer 235 and the second electrode 246 such that reliability may be degraded. Here, the width w82 of the lower surface of the reflective layer 235 may be the distance between the adjacent second electrodes 246, but the present invention is not limited thereto.

In the embodiment of FIG. 8A, lateral surfaces of the first part P1 and the second part P2 of the reflective layer are disposed with the same inclination, but in the embodiment of FIG. 8B, the lateral surfaces of the first part P1 and the second part P2 of the reflective layer may be disposed with different inclinations.

Specifically, in FIG. 8B, the second part P2 of the reflective layer is disposed with an inclination close to the vertical direction with respect to the bottom surface, but the first part P1 is disposed with an acute angle with respect to the bottom surface. This structure may control an angle of directivity of light emitted from the active layer MQW to travel to the first part P1 and the second part P2, thereby allowing the light to travel in the upward direction of the semiconductor device. The bottom surface may be parallel to and coplanar with the lower surface of the second conductive semiconductor layer 226.

In the embodiments of FIGS. 8A and 8B, the upper surface of the reflective layer is flat, but in the embodiment of FIG. 8C, the upper surface of the reflective layer may be disposed with a curvature. In FIG. 8C, the upper surface of the reflective layer having a curvature may be referred to as a third portion R.

Figure 9:
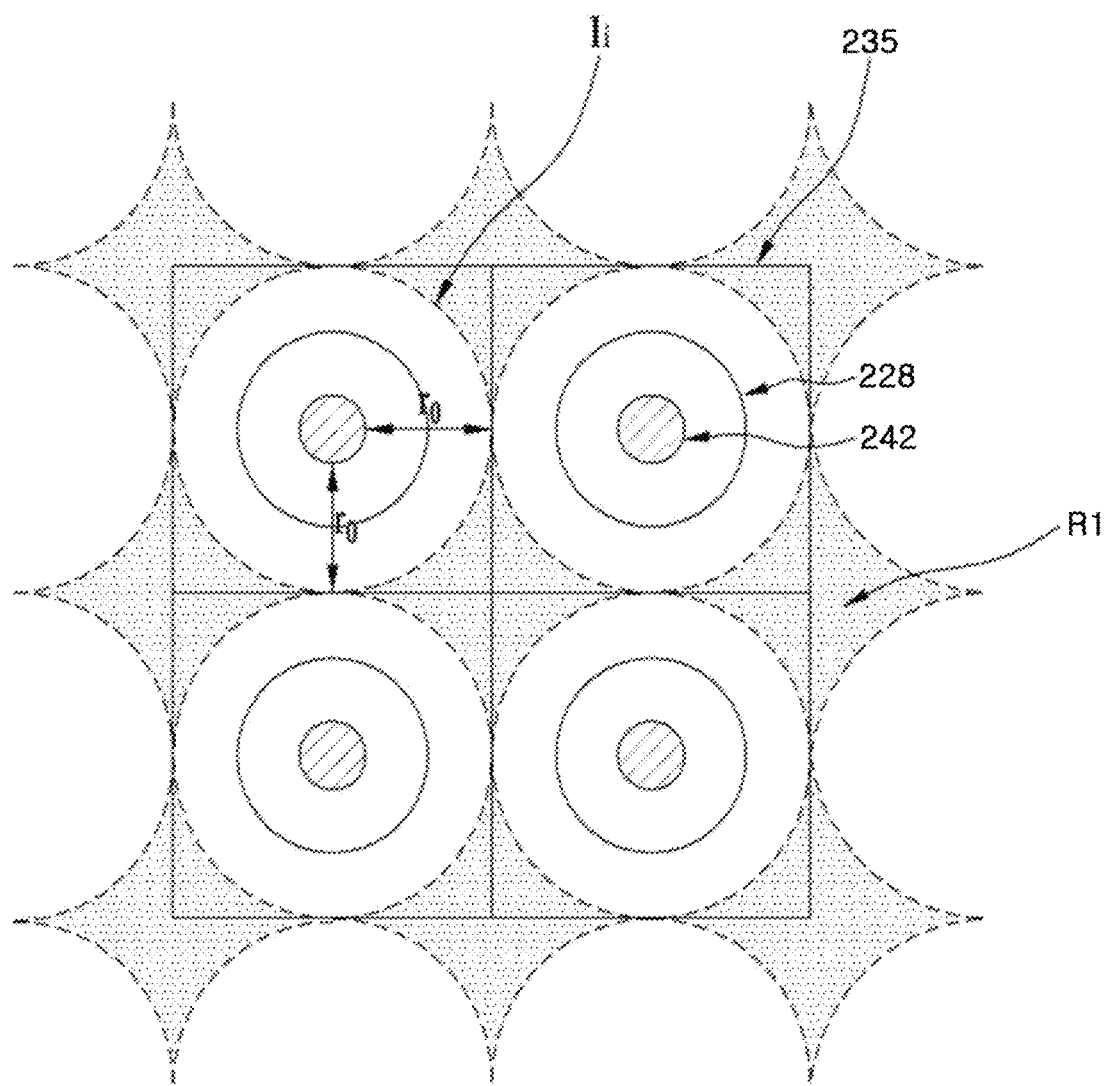
FIG. 9 is a diagram illustrating another arrangement of the reflective layer.

FIG. 9 is a diagram illustrating another arrangement of the reflective layer. FIG. 9 is a top view of some region of the semiconductor device and illustrates an arrangement of the first electrode, a recess (hole) corresponding to the first recess 228, and the reflective layer 235.

In FIG. 9, an arrangement of the first recesses 228 is different from the arrangement thereof in FIG. 6. That is, a plurality of recesses 228 are disposed in a plurality of rows in a horizontal first direction and a vertical second direction, and the plurality of recesses 228 disposed in adjacent rows in the first and second directions are disposed to correspond to each other.

In such a structure, boundary regions between adjacent recesses may be in contact with each other and may be spaced apart from each other, and the reflective layers 235 may be disposed to be circumscribed about the boundary regions.

That is, the boundary regions spaced the distance $r_0$ apart from the first electrode and the recess are indicated by dotted lines, and as described above, a current density in each of the boundary regions indicated by the dotted lines is $I_i$. The current density $I_i$ in the boundary region may be in the range of 30% to 40% of $I_0$. For example, as described above, the current density $I_i$ may be expressed as $I_i=I_0\times\exp(-1)$. Further, in the embodiments of FIGS. 6 and 9, the boundary regions around the adjacent first electrodes are in surface contact with each other, but the boundary regions may be disposed and spaced a predetermined distance apart from each other.

In accordance with the semiconductor device according to exemplary embodiments, the first electrode is disposed in each of the first recesses 228 to supply electrons and the reflective layer is disposed in the second recess 227 between the first recesses 228, and particularly, an arrangement and a shape of the reflective layer are optimized to reflect the light emitted from the active layer such that, when the semiconductor device is a light-emitting device, extraction efficiency of the light can be improved. Particularly, the reflective layer may be disposed at a position at which the current density is a predetermined value or less relative to a current density of a first ohmic contact region, i.e., at a region from which a light-emitting structure having a current density that is the predetermined value or less is removed.

Figure 10:
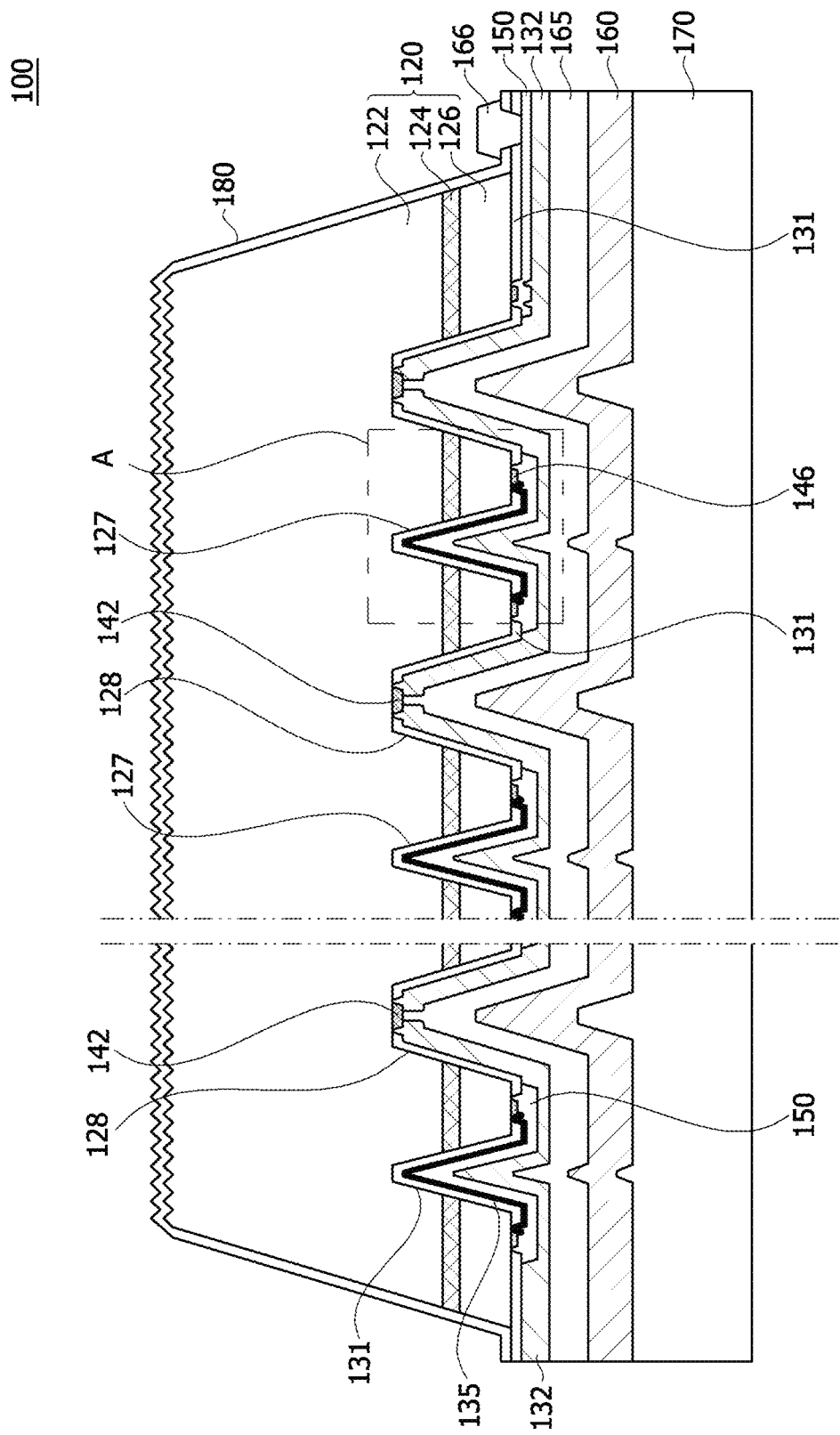
FIG. 10 is a cross-sectional view of a semiconductor device according to another embodiment of the present invention.
Figure 11:
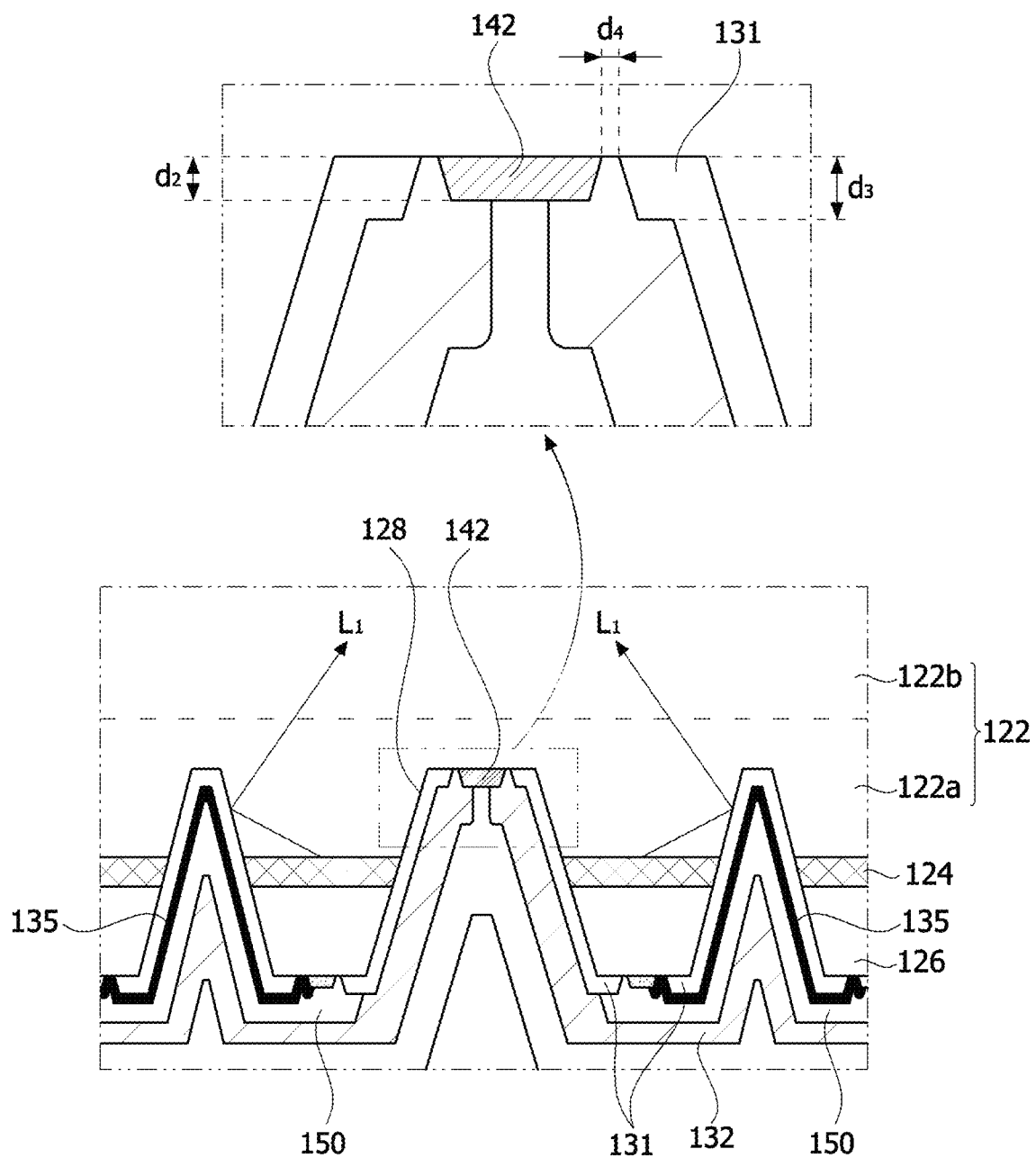
FIG. 11 is a conceptual diagram illustrating a process in which light is reflected upward by a reflective layer.
Figure 12:
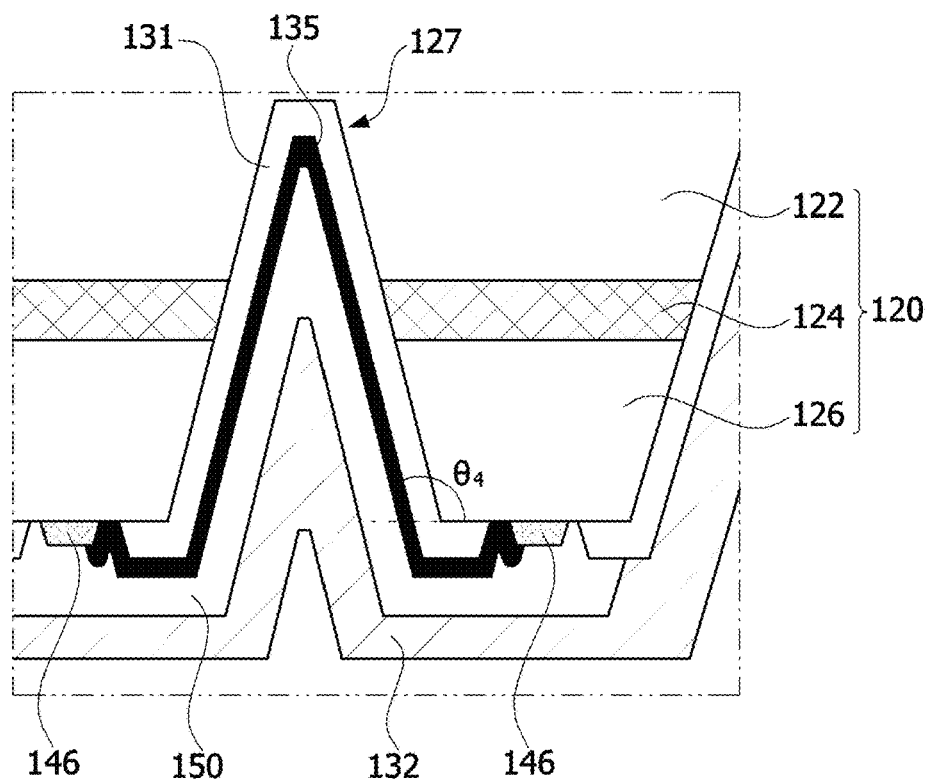
FIG. 12 is an enlarged view of Portion A of FIG. 10.
Figure 13:
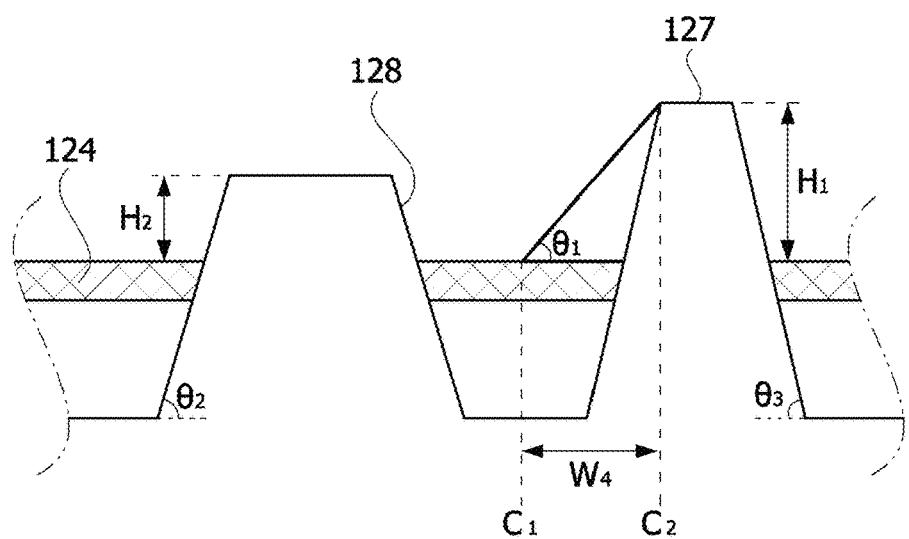
FIG. 13 is a diagram for describing a difference in height between a first recess and a second recess.

FIG. 10 is a cross-sectional view of a semiconductor device according to one embodiment of the present invention, FIG. 11 is a conceptual diagram illustrating a process in which light is reflected upward by a reflective layer, FIG. 12 is an enlarged view of Portion A of FIG. 10, and FIG. 13 is a diagram for describing a difference in height between a first recess and a second recess.

Referring to FIG. 10, a semiconductor device according to the present embodiment includes a light-emitting structure 120 having a first conductive semiconductor layer 122, a second conductive semiconductor layer 126, and an active layer 124, a first electrode 142 electrically connected to the first conductive semiconductor layer 122, and a reflective layer 135 disposed in a second recess 127.

The light-emitting structure 120 according to the present embodiment may output light in an ultraviolet wavelength range. For example, the light-emitting structure 120 may emit UV-A, UV-B, or UV-C. The ultraviolet wavelength range may be determined by an Al composition ratio of the light-emitting structure 120.

The light-emitting structure 120 includes a plurality of first recesses 128 formed up to some region of the first conductive semiconductor layer 122 by passing through the second conductive semiconductor layer 126 and the active layer 124, and at least one second recess 127 disposed between the plurality of first recesses 128.

A first insulating layer 131 may be formed on the first recess 128 and the second recess 127. The first insulating layer 131 may electrically insulate the reflective layer 135 from the active layer 124 and the first conductive semiconductor layer 122. The first insulating layer 131 may extend from the first recess 128 and the second recess 127 to the second conductive semiconductor layer 126.

The first electrode 142 may be disposed on a bottom surface of the first recess 128 to be electrically connected to the first conductive semiconductor layer 122. The first electrode 142 may be an ohmic electrode. The first electrode 142 may be formed of at least one among an indium tin oxide (ITO), an indium zinc oxide (IZO), an indium zinc tin oxide (IZTO), an indium aluminum zinc oxide (IAZO), an indium gallium zinc oxide (IGZO), an indium gallium tin oxide (IGTO), an aluminum zinc oxide (AZO), an antimony tin oxide (ATO), a gallium zinc oxide (GZO), an IZO nitride (IZON), Al—Ga ZnO (AGZO), an IGZO, ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but the present invention is not limited thereto.

The reflective layer 135 may be disposed inside the second recess 127. Specifically, the reflective layer 135 may be disposed on the first insulating layer 131 in the second recess 127.

The reflective layer 135 may be formed of a material having high reflectance in the ultraviolet wavelength range. The reflective layer 135 may include a conductive material. For example, the reflective layer 135 may include Al. When a thickness of the Al reflective layer 135 is in the range of about 30 nm to 100 nm, the light in the ultraviolet wavelength range may be reflected by 80% or more. Accordingly, it is possible to prevent the light emitted from the active layer 124 from being absorbed in the semiconductor layer.

Referring to FIG. 11, as an Al composition of the light-emitting structure 120 increases, a current diffusion characteristic in the light-emitting structure 120 may be degraded. Further, the active layer 124 increases an amount of light emitted to a side surface thereof (i.e., a TM mode) when compared to a GaN-based blue light emitting device. This TM mode may occur in an ultraviolet semiconductor device.

According to the present embodiment, since a portion of a region in which a current density is low is etched to form the reflective layer 135, light $L_1$ may be reflected upward by the reflective layer 135. Consequently, it is possible to reduce light absorption in the light-emitting structure 120 and improve extraction efficiency of the light. Further, an angle of directivity of the semiconductor device may be adjusted.

The first conductive semiconductor layer 122 may be formed of a Group III-V or II-VI compound semiconductor and may be doped with a first dopant. The first conductive semiconductor layer 122 may be formed of a semiconductor material having a composition formula of $In_{x1}Al_{y1}Ga_{1-x1-y1}N$ ($0\leq x1\leq 1$, $0\leq y1\leq 1$, and $0\leq x1+y1\leq 1$), for example, selected from among GaN, AlGaN, InGaN, InAlGaN, and the like. Further, the first dopant may be an n-type dopant such as Si, Ge, Sn, Se, or Te. When the first dopant is an n-type dopant, the first conductive semiconductor layer 122 doped with the first dopant may be an n-type semiconductor layer.

The first conductive semiconductor layer 122 may have a low resistance layer 122a having a relatively low Al concentration and a high resistance layer 122b having a relatively high Al concentration. The high resistance layer 122b may have an Al concentration in the range of 60% to 70%, and the low resistance layer 122a may have an Al concentration in the range of 40% to 50%. The low resistance layer 122a is disposed adjacent to the active layer 124.

The first electrode 142 may be disposed on the low resistance layer. That is, the first recess 128 may be preferably formed up to a region of the low resistance layer 122a. This is because the high resistance layer 122b has a high Al concentration so that a current diffusion characteristic of the high resistance layer 122b is relatively low.

The active layer 124 is a layer at which electrons (or holes) injected through the first conductive semiconductor layer 122 and holes (or electrons) injected through the second conductive semiconductor layer 126 meet. The active layer 124 may transition to be at a low energy level due to the recombination of electrons and holes and emit light having a wavelength corresponding to the transition.

The active layer 124 may have any one of a single well structure, a multi-well structure, a single quantum well structure, an MQW structure, a quantum dot structure, or a quantum wire structure, but the active layer 124 is not limited thereto. The active layer may contain Al.

The second conductive semiconductor layer 126 may be formed on the active layer 124, may be formed of a Group III-V or II-VI compound semiconductor, and may be doped with a second dopant. The second conductive semiconductor layer 126 may be formed of a material having a composition formula of $In_{x5}Al_{y2}Ga_{1-x5-y2}N$ ($0 \leq x5 \leq 1$, $0 \leq y2 \leq 1$, and $0 \leq x5+y2 \leq 1$) or may be formed of a material selected from among AlInN, AlGaAs, GaP, GaAs, GaAsP, and AlGaInP. When the second dopant is a p-type dopant such as Mg, Zn, Ca, Sr, or Ba, the second conductive semiconductor layer 126 doped with the second dopant may be a p-type semiconductor layer.

When the second conductive semiconductor layer 126 is AlGaN, hole injection may not be smooth due to low electrical conductivity. Therefore, GaN having relatively high electrical conductivity may be disposed at a lower surface of the second conductive semiconductor layer 126.

A thickness d2 of the first electrode 142 may be thinner than a thickness d3 of the first insulating layer 131, and a separation distance d4 between the first electrode 142 and the first insulating layer 131 may be provided in the range of 1 μm to 4 μm.

When the thickness d2 of the first electrode 142 is less than the thickness d3 of the first insulating layer 131, it is possible to solve problems such as delamination and cracks due to degradation of a step coverage characteristic occurring when a first conductive layer 165 is disposed. Further, the separation distance d4 between the first electrode 142 and the first insulating layer 131 is provided such that a gap-fill characteristic of a second insulating layer 132 may be improved.

Irregularities may be formed on a surface of the first conductive semiconductor layer 122. The irregularities may improve extraction efficiency of the light emitted from the light-emitting structure 120. An average height of the irregularities may be different according to the ultraviolet wavelength. In the case of UV-C, heights of the irregularities are in the range of 300 nm to 800 nm, and when the average height thereof is in the range of 500 nm to 600 nm, extraction efficiency of the light may be improved.

Referring to FIG. 12, the reflective layer 135 may cover one lateral surface of a second electrode 146 and a portion of an upper surface of the second electrode 146. With this configuration, light incident between the first insulating layer 131 and the second electrode 146 may be reflected upward. However, since a step coverage of the reflective layer 135 made of Al is relatively not good, it may not be preferable to completely cover the second electrode 146.

The second electrode 146 may be disposed on an upper surface of the second conductive semiconductor layer 126. A thickness of the second electrode 146 may be formed to be thinner than a thickness of the first insulating layer 131. Consequently, when the reflective layer 135 and a second conductive layer 150 are disposed, it is possible to solve problems such as cracks or delamination of the reflective layer 135 or the second conductive layer 150 due to degradation of a step coverage.

A first separation distance between the second electrode 146 and the first insulating layer 131 may be provided in the range 1 μm to 4 μm. When the first separation distance is less than 1 μm, it is difficult to secure a process margin to cause a problem in that an operating voltage rises, whereas when the first separation distance is longer than 4 μm, there may occur a problem in that an area in which the second electrode 146 is disposed becomes narrower such that the operating voltage rises.

In order to electrically connect the second electrodes 146 separated by the second recess 127, the reflective layer 135 may be electrically connected to the second electrode 146.

The reflective layer 135 may be disposed within the first separation distance between the second electrode 146 and the first insulating layer 131 and may be in contact with a lateral surface and an upper surface of the first insulating layer 131 and a lateral surface and an upper surface of the second electrode 146 within the first separation distance. Further, a region in which the reflective layer 135 is in Schottky contact with the second conductive semiconductor layer 126 may be disposed within the first separation distance to form a Schottky junction such that a current may be easily diffused.

An angle θ4 between an inclined portion of the reflective layer 135 and the upper surface of the second conductive semiconductor layer 126 may be in the range of 90 degrees to 145 degrees. When the inclination angle θ4 is less than 90 degrees, it is difficult to etch the second conductive semiconductor layer 126, whereas when the inclination angle θ4 is greater than 145 degrees, an area of the active layer which is etched becomes larger such that light emitting efficiency is degraded.

The second conductive layer 150 may cover the reflective layer 135 and the second electrode 146. Accordingly, a second electrode pad 166, the second conductive layer 150, the reflective layer 135, and the second electrode 146 may form one electrical channel.

The second conductive layer 150 may completely surround the reflective layer 135 and the second electrode 146 and may be in contact with the lateral surface and the upper surface of the first insulating layer 131. The second conductive layer 150 may be made of a material having high adhesive strength to the first insulating layer 131, at least one material selected from the group consisting of Cr, Al, Ti, Ni, Au, and the like, and an alloy thereof, and a single layer or a plurality of layers.

When the second conductive layer 150 is in contact with the lateral surface and the upper surface of the first insulating layer 131, thermal and electrical reliability of the reflective layer 135 and the second electrode 146 may be improved.

Further, the second conductive layer 150 may have a reflection function for reflecting the light upward, which is emitted between the first insulating layer 131 and the second electrode 146.

The second conductive layer 150 may be disposed within a second separation distance between the first insulating layer 131 and the second electrode 146. The second conductive layer 150 may be in contact with the lateral surface and the upper surface of the second electrode 146 and the lateral surface and the upper surface of the first insulating layer 131 within the second separation distance. Further, a region in which the second conductive layer 150 is in Schottky contact with the second conductive semiconductor layer 126 may be disposed within the second separation distance to form a Schottky junction such that a current may be easily diffused.

Referring back to FIG. 10, the first conductive layer 165 and a bonding layer 160 may be disposed along a lower surface of the light-emitting structure 120 and topography of the first recess 128 and the second recess 127. The first conductive layer 165 may be made of a material having high reflectance. For example, the first conductive layer 165 may include Al. When the electrode layer 165 includes aluminum, the electrode layer 165 serves to reflect light upward, which is emitted in a direction from the active layer 124 toward a substrate 170, thereby improving extraction efficiency of the light.

The second insulating layer 132 electrically insulates the reflective layer 135, the second electrode 146, and the second conductive layer 150 from the first conductive layer 165. The first conductive layer 165 may pass through the second insulating layer 132 to be electrically connected to the first electrode 142.

A thickness of the first insulating layer 131 may be less than a thickness of the second insulating layer 132. As the thickness of the first insulating layer 131 becomes thinner, an upper surface of the reflective layer 135 becomes closer to the first conductive semiconductor layer 122 such that extraction efficiency of the light may be improved.

For example, the thickness of first insulating layer 131 may be in the range of 3000 Å and 7000 Å. When the thickness of first insulating layer 131 is thinner than 3000 Å, electrical reliability may be degraded, whereas when the thickness of first insulating layer 131 is thicker than 7000 Å and the reflective layer 135 and the second conductive layer 150 are disposed on the upper surface and the lateral surface of the first insulating layer 131, a step coverage characteristic of the reflective layer 135 or the second conductive layer 150 is not good such that delamination or cracks may be caused. When delamination or cracks are caused, there may occur a problem in that electrical reliability is degraded or extraction efficiency of light may be degraded.

The thickness of second insulating layer 132 may be in the range of 4000 Å and 10000 Å. When the thickness of second insulating layer 132 is thinner than 4000 Å, electrical reliability may be degraded when a device operates, whereas when the thickness of second insulating layer 132 is thicker than 10000 Å, reliability may be degraded due to a pressure or thermal stress applied to the device during a process, and a process time may be prolonged such that a unit cost of the device increases. The thicknesses of the first insulating layer 131 and the second insulating layer 132 are not limited thereto.

The bonding layer 160 may include a conductive material. For example, the bonding layer 160 may include a material selected from the group consisting of Au, Sn, In, Al, Si, Ag, Ni, and Cu, or an alloy thereof.

The substrate 170 may be made of a conductive material. For example, the substrate 170 may include a metal or a semiconductor material. The substrate 170 may be a metal having high electrical conductivity and/or high thermal conductivity. In this case, heat generated during an operation of the semiconductor device may be rapidly dissipated to the outside.

The substrate 170 may include a material selected from the group consisting of Si, Mo, Si, W, Cu, and Al, or an alloy thereof.

The second electrode pad 166 may be made of a conductive material. The second electrode pad 166 may have a single-layer or multi-layer structure and may include Ti, Ni, Ag, and Au. For example, the second electrode pad 166 may have a structure of Ti/Ni/Ti/Ni/Ti/Au.

A passivation layer 180 may be disposed on an upper surface and a lateral surface of the light-emitting structure 12. A thickness of the passivation layer 180 may be in the range of 2000 Å and 5000 Å. When the thickness of the passivation layer 180 is thinner than 2000 Å, the passivation layer 180 may not be sufficient to protect the device from external moisture or foreign materials to degrade electrical and optical reliability of the device, whereas when the thickness of the passivation layer 180 is thicker than 5000 Å, stress applied to the device may become larger to degrade the optical reliability or the process time may be prolonged to increase a unit cost.

Referring to FIG. 13, a protruding height $H_1$ of the second recess 127 may be lower than a protruding height $H_2$ of the first recess 128. Here, the protruding heights may be defined as vertical distances from the active layer 124 to upper surfaces of the first recess 128 and the second recess 127.

Specifically, the protruding height $H_1$ of the second recess 127 may satisfy the following relational expression 1.

$$H_1 = W_4 \times \tan(\theta_1) \quad \text{Relational Expression 1}$$

Here, $W_4$ is a distance from an intermediate point C1 between the first recess 128 and the second recess 127 which are adjacent to each other to an upper surface C2 of the second recess, and $\theta_1$ is in the range of 0.5 degrees to 5.0 degrees.

When $\theta_1$ is less than 0.5 degrees, a height of the reflective layer becomes relatively lower such that it may be difficult to perform an effective reflection function. Further, when $\theta_1$ exceeds 5.0 degrees, the height of the reflective layer becomes too higher such that there is a problem in that an area of the active layer excessively decreases in proportional to the height of the reflective layer. Furthermore, there is a problem in that a recess process and an insulating process should be managed more accurately.

For example, the distance from the intermediate point C1 to the upper surface C2 of the second recess may be in the range of 20 μm to 40 μm, and $\theta_1$ may be 2.3 degrees. The protruding height of the second recess 127 may be in the range of about 300 nm to 800 nm. In this case, light emitted from the active layer 124 in a TM mode may be effectively reflected upward.

The second recess 127 may be formed to be higher than the first recess 128. However, the present invention is not particularly limited thereto, and the height of the first recess 128 may be equal to the height of the second recess 127.

An inclined angle $\theta_2$ of the first recess 128 may be in the range of 40 degrees to 70 degrees or 60 degrees to 70 degrees, and an inclined angle $\theta_3$ of the second recess 127 may be in the range of 40 degrees to 70 degrees or 60 degrees to 70 degrees.

Figure 14:
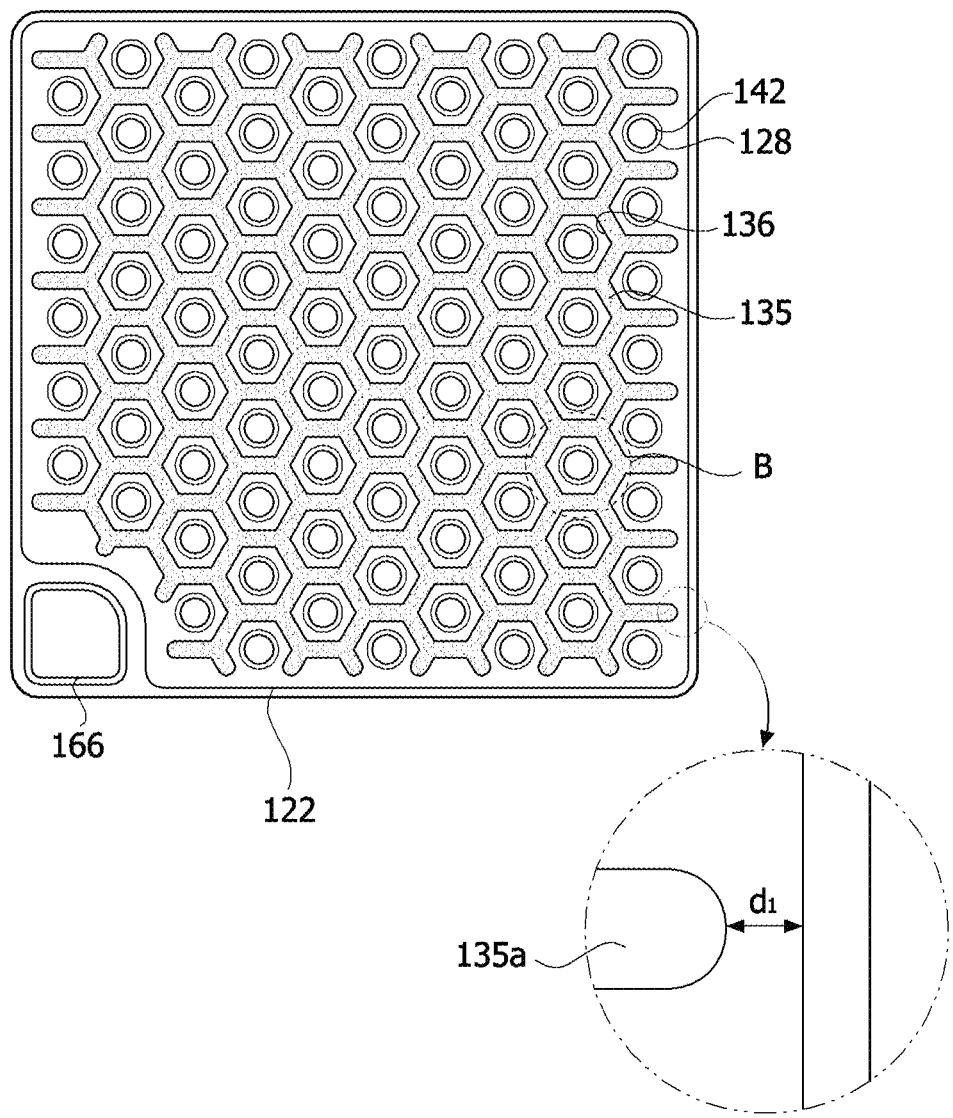
FIG. 14 is a plan view of the semiconductor device according to one embodiment of the present invention.
Figure 15:
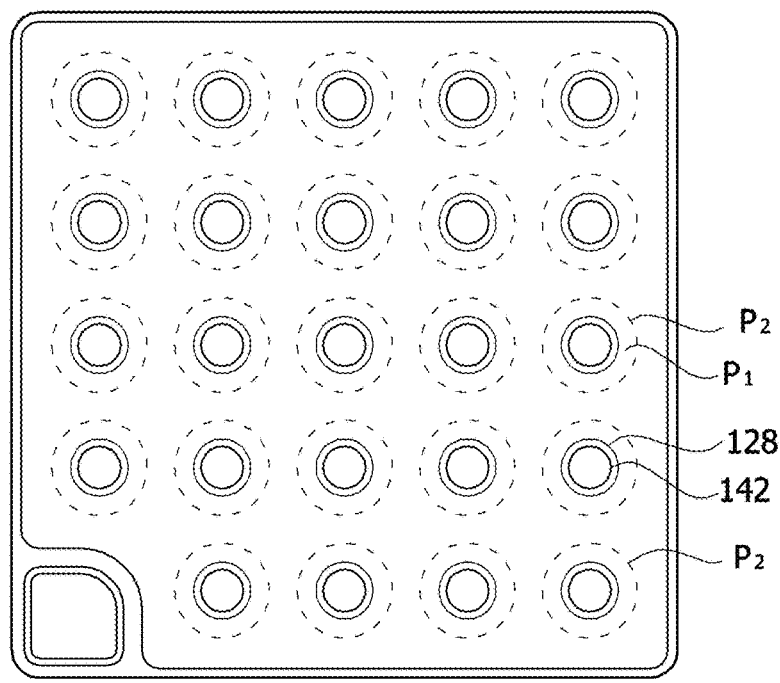
FIG. 15 is a diagram showing a distribution of a current density of the semiconductor device.
Figure 16:
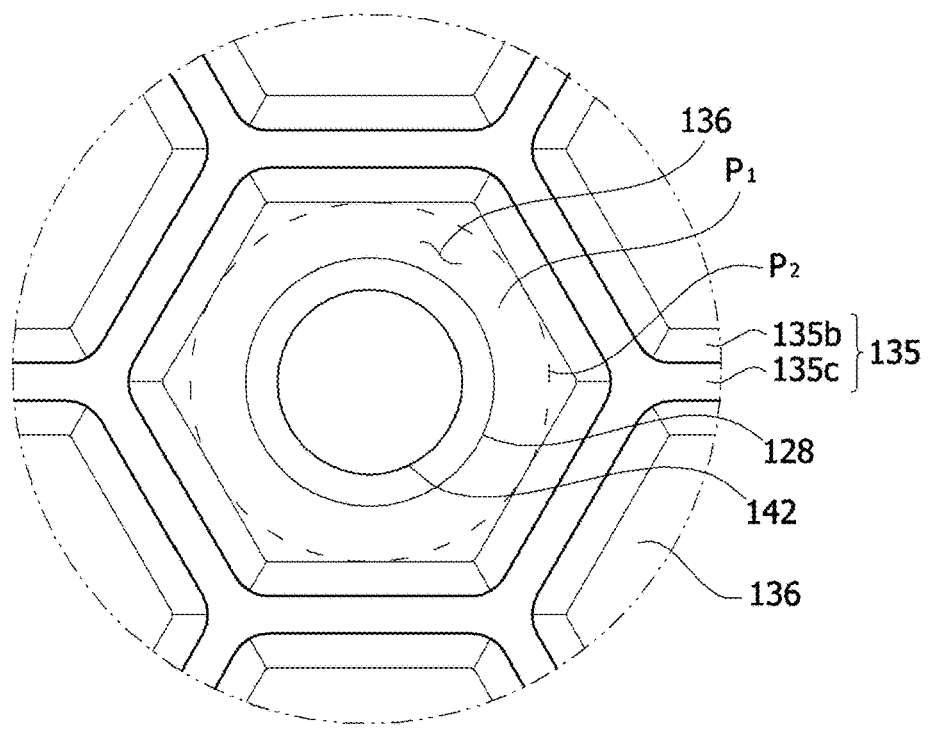
FIG. 16 is an enlarged view of Portion B of FIG. 14.
Figure 17:
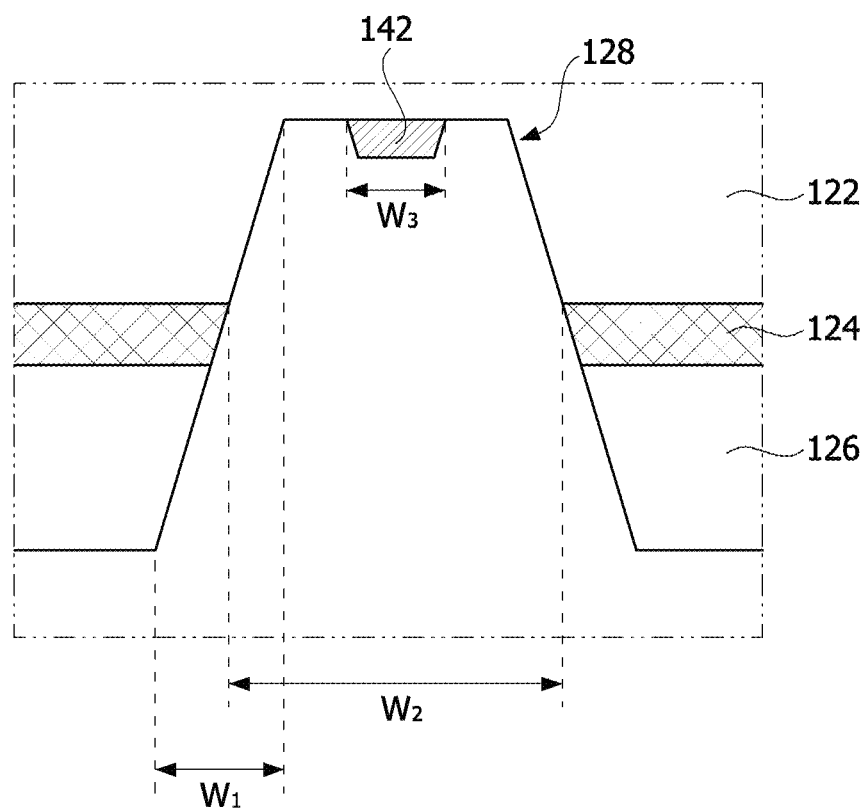
FIG. 17 is a diagram illustrating the first recess.
Figure 18:
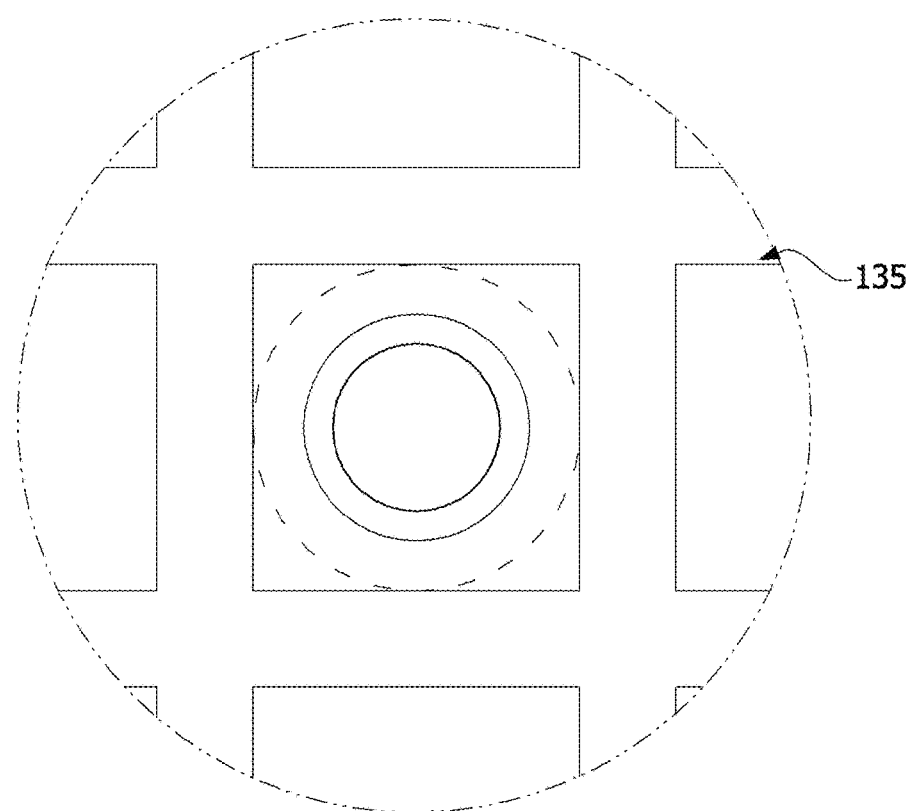
FIG. 18 is a diagram illustrating a modified embodiment of FIG. 16.

FIG. 14 is a plan view of a semiconductor device according to one embodiment of the present invention, FIG. 15 is a diagram showing a distribution of a current density of the semiconductor device, FIG. 16 is an enlarged view of Portion B of FIG. 14, FIG. 17 is a diagram illustrating the first recess 128, and FIG. 18 is a diagram illustrating a modified embodiment of FIG. 16.

Referring to FIG. 14, a semiconductor device 100 may include a plurality of active regions 136, each of which is separated by the reflective layer 135 on a plan view. The active region 136 may be an independent space separated by the reflective layer 135. The active region 136 may have various shapes. For example, a shape of the active region 136 may be a polygonal or circular shape.

Each of a plurality of first electrodes 142 and a plurality of first recess 128 may be disposed in the active region 136. According to such a structure, the reflective layer 135 surrounds the first electrode 142 in which a current is diffused. Thus, light emitted in the vicinity of the first electrode 142 may be reflected upward by the reflective layer 135 surrounding the active region 136.

The reflective layer 135 may be disposed in a region in which regions, each of which has a current density of 40% or less relative to the current density of 100% of the first electrode 142, are connected. For example, a distance between a center of the first recess and a center of the second recess disposed on a horizontal line of the first recess may be in the range of 30 μm and 40 μm.

When the distance is shorter than 30 μm, the active layer in a region having high current diffusion may be etched to degrade light emission efficiency, whereas when the distance is longer than 40 μm, a region with a poor current diffusion characteristic remains such that extraction efficiency of light may be degraded. When the reflective layer is formed in a region having a current density of less than 30%, an area of the active region may excessively become wider such that the extraction efficiency of light may be degraded. Further, there is a high possibility that a considerable portion of the light emitted to a lateral surface is absorbed in the light-emitting structure.

The reflective layer 135 may include a plurality of distal end parts 135a adjacent to an edge of the first conductive semiconductor layer 122, and a distance d1 between the distal end part 135a and the edge of the first conductive semiconductor layer 122 may be in the range of 1.0 μm and 10 μm. When the distance d1 is less than 1.0 μm, it may be difficult to secure a process margin, whereas when the distance d1 is greater than 10 μm, the region with the poor current diffusion characteristic is not utilized such that extraction efficiency of the light may be degraded. However, the present invention is not limited thereto, and the distal end part 135a of the reflective layer 135 may also be sealed to form an active region.

Referring to FIG. 15, when a composition of Al is high, a current diffusion effect may be weakened. Accordingly a current is diffused to only a position adjacent to the first electrode 142 such that a current density may be drastically lowered at a position away from the first electrode 142. Therefore, an effective light emitting region P2 is narrow. The effective light emitting region P2 may be defined as a boundary position with a current density of 40% or less relative to a position P1 in the vicinity of the first electrode, which has a highest current density.

For example, the distance between the center of the first recess and the center of the second recess disposed on the horizontal line of the first recess may be in the range of 30 μm and 40 μm. When the distance is shorter than 30 μm, the active layer in a region having high current diffusion may be etched to degrade light emission efficiency, whereas when the distance is longer than 40 μm, a region with a poor current diffusion characteristic remains such that extraction efficiency of light may be degraded.

Specifically, an intermediate position between adjacent first electrodes 142 may have a low current density such that efficiency contributing to light emission may be extremely low. Therefore, the present embodiment can improve extraction efficiency of light by forming the reflective layer in a low current density region.

Referring to FIG. 16, the reflective layer 135 may include an inclined part 135b and an upper surface part 135c. Most of the light emitted from the active layer 124 may be reflected upward by the inclined part 135b.

The active region 136 defined by the reflective layer 135 may have an area of 2.0 to 5.0 times the area of the first electrode 142. In this case, the reflective layer 135 may be formed in a region having a current density of 40% or less based on the first electrode 142. Alternatively, the active region 136 defined by the reflective layer 135 may have an area of 2.0 to 5.0 times the area of the first recess 128. The area of the active region 136 may be adjusted according to an Al concentration of the light-emitting structure 120.

A center of the reflective layer 135 may be disposed in a region in which the current density is lowered to 40% or less, e.g., at a separation distance from a center of the first recess 128 in the range of 30 μm to 40 μm, and a width of the reflective layer 135 may be in the range of 2 μm to 5 μm.

When the width of the reflective layer 135 is narrower than 2 μm, a step coverage characteristic of a material constituting the reflective layer 135 may be degraded to cause cracks or delamination, whereas when the width of the reflective layer 135 is wider than 5 μm, an effective active layer may be etched to cause degradation of light emission efficiency.

The reflective layer 135 may have a shape configured with straight lines in contact with a boundary region in which the current density is lowered to 40% or less. For example, when an isolated region has a circular shape, the reflective layer 135 may have a polygonal shape configured with straight lines in contact with the circular shape.

Referring to FIG. 17, the active layer 124 is removed from a region in which the first recess 128 is formed such that the region is not involved in light emission. An area which is not actually involved in the light emission is a first area W2 from which the active layer 124 is removed. The width of the first recess 128 may be varied according to a width W1 of the inclined surface. Therefore, it may be preferable to manufacture the inclined angle of the inclined surface to be larger. For example, an angle of the inclined surface may be in the range of 40 degrees and 70 degrees or 60 degrees and 70 degrees.

Referring to FIG. 18, the shape of the reflective layer 135 may have a shape in which a rectangular matrix is continuously disposed. As described above, the shape of the active region 136 formed by the reflective layer 135 may be variously deformed. For example, the shape of active region 136 may be a hexagonal shape, an octagonal shape, a triangular shape, or a circular shape.

The above-described semiconductor device may be configured in a package and thus may be used for curing of a resin, a resist, superoxide dismutase (SOD), or a spin on glass (SOG), for a medical use such as atopy treatment, or for sterilization of an air cleaners or a water purifier. Further, the semiconductor device may be used as a light source of a lighting system. For example, the semiconductor device may be used as a light source of an image display device or a lighting device.

When the semiconductor device is used as a backlight unit of an image display device, the semiconductor device may be used as an edge type backlight unit or a direct-type backlight unit, and, when the semiconductor device is used as a light source of a lighting device, the semiconductor device may be used as lighting equipment or bulb type equipment, and also may be used as a light source of a mobile terminal.

Figure 19:
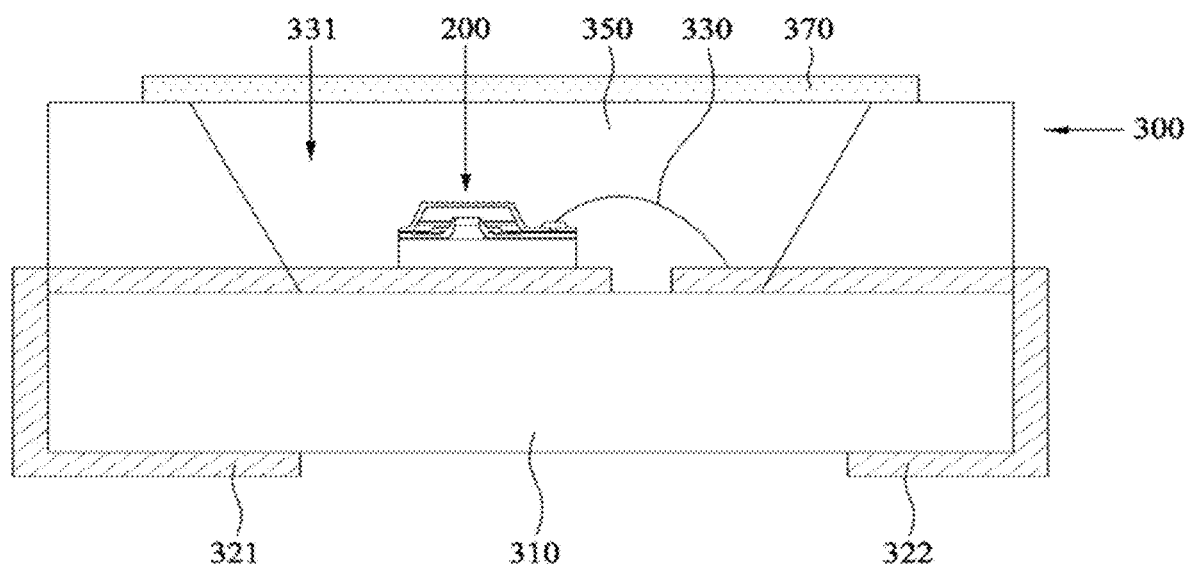
FIG. 19 is a diagram illustrating a package in which the semiconductor device is disposed.

FIG. 19 is a diagram illustrating a package in which the semiconductor device is disposed.

A light-emitting device package 300 according to the present embodiment includes a package body 310, a first electrode part 321, a second electrode part 322, and a light-emitting device 200.

The package body 310 may be made of an insulating material having a cavity 311. For example, the insulating material may include a polyphthalamide (PPA) resin, a silicon-based material, or the like.

The first electrode part 321 and the second electrode part 322 may be disposed on the package body 310, and some portion of the first electrode part 321 and the second electrode part 322 may be disposed on a bottom surface of the cavity 311.

The light-emitting device 300 may be the above-described light-emitting device, may be disposed on the first electrode part 321, and may be electrically connected to the second electrode part 322 through a wire 330.

A molding part 350 is disposed around the light-emitting device 200 and the wire 330. The molding part 350 may be filled with air or other protective material. In the case of a light-emitting device which emits ultraviolet rays, when the molding part 350 is filled with a silicon-based material, defects such as cracks may be caused in the molding part 350 due to energy corresponding to a wavelength of the ultraviolet rays such that reliability may be degraded. The molding part 350 may include a phosphor (not shown). The phosphor may include a yttrium aluminum garnet (YAG)-based phosphor, a nitride-based phosphor, a silicate, or a mixture thereof, but the present invention is not limited thereto. A cover 370 is disposed on an upper portion of the light-emitting device package 300 and may be made of a light transmittance material such as glass.

In addition to the shape of the package in FIG. 19, the semiconductor device may be flip-bonded and used as a package.

The light-emitting device includes a laser diode in addition to the above-described light-emitting diode, and the structure of the light-emitting device according to the present embodiment may be applied to other semiconductor devices such as a laser diode.

Light emitted from the semiconductor device is mixed with light of various wavelength ranges and may be radially emitted about the semiconductor device.

Like the semiconductor device, the laser diode may include the above-described structure of the first conductive semiconductor layer, the active layer, and the second conductive semiconductor layer. Further, the laser diode uses an electro-luminescence phenomenon in which light is emitted from the active layer when a current flows after a p-type first conductivity type semiconductor and an n-type second conductivity type semiconductor are bonded, but there are differences in directivity and wavelength range of light between the light emitting device and the laser diode. That is, the laser diode may emit light having the same phase in the same direction at a specific single wavelength (i.e., a monochromatic beam) using a phenomenon referred to as stimulated emission and a constructive interference phenomenon, and, with the above-described characteristic, the laser diode may be used for optical communication.

A light-receiving device may refer to a photodetector which is a kind of transducer which detects light and converts an intensity of the detected light into an electric signal. Such a photodetector may include a photocell (silicon or selenium), a photoconductive element (cadmium sulfide or cadmium selenide), a photodiode (PD) (e.g., a PD having a peak wavelength in a visible blind spectral region or in a true blind spectral region), a phototransistor, a photomultiplier, a photoelectric tube (vacuum or gas filling), an infra-red (IR) detector, or the like, but the present invention is not limited thereto.

Further, the semiconductor device such as the photodetector may be manufactured using a direct bandgap semiconductor of which photoconversion efficiency is generally excellent. Alternatively, the photodetector has a variety of structures, and includes a pin-type photodetector using a p-n junction which is a most general structure, a Schottky-type photodetector using a Schottky junction, and a metal-semiconductor-metal (MSM)-type photodetector. Among the photodetectors, the pin-type photodetector and the Schottky-type photodetector may be implemented using a nitride semiconductor material.

Like the semiconductor device, the photodiode and the laser diode may include the above-described structure of the first conductive semiconductor layer, the active layer, and the second conductive semiconductor layer and may be configured with a p-n junction or a pin structure. When a reverse bias is applied to the photodiode, resistance becomes very high and thus a minute current flows. However, when light is incident into the photodiode, electrons and holes are generated and thus a current flows, and at this point, a magnitude of a voltage is almost proportional to an intensity of the light incident into the photodiode.

A photovoltaic cell or a solar cell is a kind of a photodiode and may convert light into a current using an photoelectric effect. Like the semiconductor device, the solar cell may include the above-described structure of the first conductive semiconductor layer, the active layer, and the second conductive semiconductor layer. When sunlight is incident from the outside, electrons and holes are generated in an n-type first conductive semiconductor layer and a p-type second conductive semiconductor layer, the generated electrons and holes move to an n-type electrode and a p-type electrode, and when the n-type electrode and the p-type electrode are connected to each other, the electrons move from the n-type electrode to the p-type electrode such that a current flows.

The solar cell may be classified into a crystalline solar cell and a thin film solar cell, and the thin film solar cell may be classified into an inorganic thin film solar cell and an organic thin film solar cell.

Further, the above-described semiconductor device is not necessarily implemented with a semiconductor, and in some cases, the semiconductor device may further include a metal material. For example, the semiconductor device such as the light-receiving device may be implemented using at least one among Ag, Al, Au, In, Ga, N, Zn, Se, and As or may also be implemented using a semiconductor material doped with a p-type or n-type dopant or an intrinsic semiconductor material.

While the present invention has been mainly described with reference to the embodiments, it should be understood that the present invention is not limited to the disclosed exemplary embodiments, and various modifications and applications can be devised by those skilled in the art without departing from the gist of the present invention. For example, the various components illustrated in detail in the exemplary embodiments may be combined with and coupled to one another to implement various configurations by modifying the various components illustrated in the exemplary embodiments. It should be construed that differences related to these modifications and applications will fall within the scope of the present invention defined by the appended claim.

The invention claimed is:

1. A semiconductor device comprising:
   a conductive substrate;
   a light-emitting structure provided on the conductive substrate and including a first conductive semiconductor layer, an active layer, a second conductive semiconductor layer, a plurality of first recesses, and a plurality of second recesses, wherein the first and second recesses extend from the second conductive semiconductor layer to the first conductive semiconductor layer by passing through the active layer;
   a first electrode in contact with the first conductive semiconductor layer in the first recess;
   a second electrode in contact with the second conductive semiconductor layer at a lower surface of the light-emitting structure; and
   a reflective layer provided in the second recess,
   wherein the reflective layer includes a reflection part provided inside the second recess and an extension part extending to the outside of the second recess to be in contact with the second electrode,
   wherein the reflection part of the reflective layer extends from the second electrode to the second recess and is provided at an upper portion of the second recess along a lateral portion thereof, and
   wherein the upper portion of the second recess is higher than the active layer.

2. The semiconductor device of claim 1, wherein:
   the light-emitting structure has a predetermined height between the lower surface of the light-emitting structure and the upper portion of the second recess; and
   a width of a lower surface of the reflective layer is in a range of 1.5 to 28 times a height of the reflective layer.

3. The semiconductor device of claim 1, wherein:
   the semiconductor structure includes a low current density region provided between the plurality of first recess; and
   the reflective layer is provided in the low current density region.

4. The semiconductor device of claim 3, wherein a horizontal cross section of the reflective layer has a honeycomb shape.

5. The semiconductor device of claim 3, wherein a current density in the low current density region is in a range of 30% to 40% of a current density in a region in which the first electrode is provided.

6. The semiconductor device of claim 5, wherein a width of an upper surface of the first recess is greater than a width of an upper surface of the second recess.

7. The semiconductor device of claim 3, wherein the reflective layers have a mutually extended structure by providing the low current density regions to extend from one another and providing the reflective layers in the low current density regions.

8. The semiconductor device of claim 3, wherein:
   the reflective layer is provided to surround the first recess.

9. The semiconductor device of claim 3, wherein:
   an angle between the lateral surface of the first part and a bottom surface is smaller than an angle between the lateral surface of the second part and the bottom surface; and
   the bottom surface is coplanar with a lower surface of the second conductive semiconductor layer.

10. The semiconductor device of claim 3, wherein a height of the first recess is equal to a height of the second recess.

11. The semiconductor device of claim 1, wherein the width of the lower surface of the reflective layer is a distance between adjacent second electrodes.

12. A semiconductor device comprising:
    a conductive substrate;
    a light-emitting structure provided on the conductive substrate and including a first conductive semiconductor layer, an active layer, a second conductive semiconductor layer, a plurality of first recesses, and a plurality of second recesses, wherein the first and second recesses extend from the second conductive semiconductor layer to the first conductive semiconductor layer by passing through the active layer;
    a first electrode in contact with the first conductive semiconductor layer in the first recess;
    a second electrode in contact with the second conductive semiconductor layer at a lower surface of the light-emitting structure; and
    a reflective layer provided in the second recess,
    wherein:
    the reflective layer includes a reflection part provided inside the second recess and an extension part extending to the outside of the second recess to be in contact with the second electrode;
    the reflective layer includes a first part corresponding to the first conductive semiconductor layer and a second part corresponding to the second conductive semiconductor layer; and
    an inclination of a lateral surface of the first part is different from an inclination of a lateral surface of the second part.

13. A semiconductor device comprising:
    a conductive substrate;
    a light-emitting structure provided on the conductive substrate and including a first conductive semiconductor layer, an active layer, a second conductive semiconductor layer, a plurality of first recesses, and a plurality of second recesses, wherein the first and second recesses extend from the second conductive semiconductor layer to the first conductive semiconductor layer by passing through the active layer;
    a first electrode in contact with the first conductive semiconductor layer in the first recess;
    a second electrode in contact with the second conductive semiconductor layer at a lower surface of the light-emitting structure; and
    a reflective layer provided in the second recess,
    wherein:
    the reflective layer includes a reflection part provided inside the second recess and an extension part extending to the outside of the second recess to be in contact with the second electrode;
    the light-emitting structure includes a plurality of active regions separated by the second recess when viewed from above;
    the first electrode is provided in each of the plurality of active regions; and an area of the plurality of active region is in a range of 2.0 to 5.0 times an area of the upper surface of the first recess.

14. A semiconductor device comprising:
a conductive substrate;
a light-emitting structure provided on the conductive substrate and including a first conductive semiconductor layer, an active layer, a second conductive semiconductor layer, a plurality of first recesses, and a plurality of second recesses, wherein the first and second recesses extend from the second conductive semiconductor layer to the first conductive semiconductor layer by passing through the active layer;
a first electrode in contact with the first conductive semiconductor layer in the first recess;
a second electrode in contact with the second conductive semiconductor layer at a lower surface of the light-emitting structure; and
a reflective layer provided in the second recess,
wherein:
the reflective layer includes a reflection part provided inside the second recess and an extension part extending to the outside of the second recess to be in contact with the second electrode;
the first conductive semiconductor layer includes a low resistance layer provided adjacent to the active layer and a high resistance layer provided on the low resistance layer;
the high resistance layer has an Al content that is higher than that of the low resistance layer; and
the first electrode is provided on the low resistance layer.

15. A semiconductor device comprising:
a light-emitting structure having a first conductive semiconductor layer, an active layer, a second conductive semiconductor layer, and a plurality of first and second recesses formed from the second conductive semiconductor layer to some region of the active layer and the first conductive semiconductor layer, and configured to emit light in an ultraviolet wavelength range,
a first electrode provided on a lower surface of the first conductive semiconductor layer exposed in each of the plurality of first recesses,
a boundary region predetermined in each of the plurality of first recesses, a second electrode provided on a lower surface of the second conductive semiconductor layer, and
a reflective layer provided at a height corresponding to a portion of the first conductive semiconductor layer and the active layer in each of the plurality of second recesses,
wherein the semiconductor device further include a low current density region provided between the predetermined boundary regions of the plurality of first recesses, and the reflective layer is provided in the low current density region.

16. The semiconductor device of claim 15, wherein a horizontal cross section of the reflective layer includes a honeycomb shape.

17. The semiconductor device of claim 15, wherein a predetermined value is in the range of 30% to 40% of I0, and the I0 is a current density in the first conductive semiconductor layer in contact with the first electrode.

18. The semiconductor device of claim 15, wherein a region in which the current density has the predetermined value around the first electrode is referred to as a boundary region, and a cross section of the reflective layer is provided to be circumscribed about a cross section of the boundary region.

19. The semiconductor device of claim 15, wherein the reflective layers have a mutually extended structure by providing the low current density regions to extend from one another and the reflective layers in the low current density regions.

20. The semiconductor device of claim 19, wherein the reflective layer is provided to surround each of the plurality of first recesses.

* * * * *